US009240226B2

(12) United States Patent
Ogiwara et al.

(10) Patent No.: US 9,240,226 B2
(45) Date of Patent: Jan. 19, 2016

(54) SEMICONDUCTOR STORAGE DEVICE

(71) Applicant: KABUSHIKI KAISHA TOSHIBA, Minato-ku (JP)

(72) Inventors: Ryu Ogiwara, Yokohama (JP); Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/202,630

(22) Filed: Mar. 10, 2014

(65) Prior Publication Data
US 2015/0036410 A1    Feb. 5, 2015

Related U.S. Application Data

(60) Provisional application No. 61/862,163, filed on Aug. 5, 2013.

(51) Int. Cl.
*G11C 7/06* (2006.01)
*G11C 7/00* (2006.01)
(Continued)

(52) U.S. Cl.
CPC    *G11C 7/065* (2013.01); *G11C 7/12* (2013.01); *G11C 7/06* (2013.01); *G11C 7/08* (2013.01); *G11C 11/4091* (2013.01)

(58) Field of Classification Search
CPC ...... G11C 7/065; G11C 11/4091; G11C 7/08; G11C 7/06
USPC .......... 365/189.07, 189.09, 189.11, 205, 207, 365/210.1, 210.15
See application file for complete search history.

(56) References Cited

U.S. PATENT DOCUMENTS 6,088,278 A *  7/2000  Porter et al. .................. 365/208
6,954,389 B2  10/2005  Nakamura
(Continued)

FOREIGN PATENT DOCUMENTS

JP    8-221983    8/1996
JP    9-147559    6/1997
(Continued)

OTHER PUBLICATIONS

Shunichi Suzuki, et al., "Threshold Difference Compensated Sense Amplifier", IEEE Journal of Solid-State Circuits., vol. SC-14, No. 6, Dec. 1979, pp. 1066-1070.
(Continued)

*Primary Examiner* — Ly D Pham
(74) *Attorney, Agent, or Firm* — Oblon, McClelland, Maier & Neustadt, L.L.P.

(57) ABSTRACT

A memory includes a first and second cell storing first data and second or reference-data. A first and second bit-lines connected to the first and second cells respectively correspond to a first and second sense-nodes. A first transfer-gate is inserted/connected between the first bit-line and the first sense-node. A second transfer-gate is inserted/connected between the second bit-line and the second sense-node. A sense-amplifier is inserted or connected between the first and second sense-nodes. A preamplifier includes a first and second common-transistors. The first common-transistor applies a first power-supply voltage to either the first or the second sense-node according to the first and second data or according to the first and reference-data during a data-read-operation. The second common-transistor applies a second power-supply voltage to the other sense-node out of the first and second sense-nodes according to the first and second data or according to the first and reference data.

16 Claims, 17 Drawing Sheets

(51) Int. Cl.
*G11C 7/10* (2006.01)
*G11C 7/14* (2006.01)
*G11C 7/12* (2006.01)
*G11C 7/08* (2006.01)
*G11C 16/24* (2006.01)
G11C 11/4091 (2006.01)

(56) References Cited

U.S. PATENT DOCUMENTS

| | | | | |
|---|---|---|---|---|
| 2009/0190415 A1* | 7/2009 | Kim | | 365/189.14 |
| 2010/0135062 A1* | 6/2010 | Kim | | 365/145 |
| 2010/0149895 A1* | 6/2010 | Kim | | 365/207 |

FOREIGN PATENT DOCUMENTS

| | | |
|---|---|---|
| JP | 3415956 | 6/2003 |
| JP | 2005-50439 | 2/2005 |
| JP | 4304697 | 7/2009 |

OTHER PUBLICATIONS

Tohru Furuyama, et al., "A New Sense Amplifier Technique for VLSI Dynamic Ram's", IEDM81, Dec. 1981, pp. 44-47 and Cover Page.

Yohji Watanabe, et al., "Offset Compensating Bit-Line Sensing Scheme for High Density DRAMs", 1992 Symposium on VLSI Circuits Digest of Technical Papers, 1992, pp. 116-117.

Junji Tominaga, et al., "Electrical-field induced giant magnetoresistivity in (non-magnetic) phase change films", Applied Physics Letters 99, 152105, 2011, 4 pages.

N. Shibata, et al., "A 19nm 112.8mm$^2$ 64Gb Multi-Level Flash Memory with 400Mb/s/pin 1.8V Toggle Mode Interface", International Solid-State Circuits Conference 2012, Session 25, Non-Volatile Memory Solutions, 25.1, 3 pages.

Takayuki Kawahara, et al., "2 Mb SPRAM (Spin-Transfer Torque RAM) With Bit-by-Bit Bi-Directional Current Write and Parallelizing-Direction Current Read", IEEE Journal of Solid-State Circuits, vol. 43, No. 1, Jan. 2008, 12 pages.

Woo Yeong Cho, et al., "A 0.18μm 3.0V 64Mb Non-Volatile Phase-Transition Random-Access Memory (PRAM)", International Solid-State Circuits Conference 2004, Session 2, Non-Volatile Memory, 2.1, 9 pages.

Youngdon Choi, et al., "A 20nm 1.8V 8Gb PRAM with 40MB/s Program Bandwidth", International Solid-State Circuits Conference 2012, Session 2, High Bandwidth DRAM & PRAM, 2.5, 3 pages.

Tz-Yi Liu, et al., "A 130.7mm$^2$ 2-Layer 32Gb ReRAM Memory Device in 24nm Technology", International Solid-State Circuits Conference 2013, Session 12, Non-Volatile Memory Solutions, 12.1, 3 pages.

* cited by examiner

SEMICONDUCTOR STORAGE DEVICE

CROSS REFERENCE TO RELATED APPLICATIONS

This application is based upon and claims the benefit of priority from the U.S. Provisional Patent Application No. 61/862,163, filed on Aug. 5, 2013, the entire contents of which are incorporated herein by reference.

FIELD

The embodiments of the present invention relate to a semiconductor device and manufacturing method thereof.

BACKGROUND

There has been generally known a system for reading mutually complementary memory cell data or memory cell data and reference cell data from two memory cells to paired bit lines, and for detecting/comparing and amplifying a difference between the mutually complementary memory cell data or between the memory cell data and the reference cell data using a sense amplifier in semiconductor storage devices such as a DRAM (Dynamic Random Access Memory), a molecular memory, a NAND flash memory, a NOR flash memory, a PRAM or PCM (Phase-Change Random Access Memory), an iPCM (interfacial PCM), a ReRAM (Resistance Random Access Memory), and an FeRAM (Ferroelectric Random Access Memory), MRAM (Magnetic RAM). In recent years, due to downscaling of memory cells and reduction in power supply voltages, a signal difference between mutually complementary memory cell data or that between memory cell data and reference cell data read from memory cells has become increasingly smaller. When the signal difference between the mutually complementary memory cell data or that between the memory cell data and the reference cell data read from the memory cells is smaller, each sense amplifier possibly erroneously detects/compares and amplifies data logic depending on the irregularity in a threshold voltage between a pair of transistors that constitutes the sense amplifier.

DETAILED DESCRIPTION

A semiconductor storage device according to the present embodiment comprises a first memory cell configured to store therein first logical data and a second memory cell configured to store therein second logical data or reference data. A first bit line is connected to the first memory cell and a second bit line is connected to the second memory cell. A first sense node corresponds to the first bit line and a second sense node corresponds to the second bit line. A first transfer gate is inserted or connected between the first bit line and the first sense node and a second transfer gate is inserted or connected between the second bit line and the second sense node. A sense amplifier is inserted or connected between the first sense node and the second sense node and is configured to detect, compare, or amplify a voltage difference between the first sense node and the second sense node. A preamplifier includes a first common transistor and a second common transistor. The first common transistor is configured to apply a first power supply voltage to either the first sense node or the second sense node according to the first logical data and the second logical data or according to the first logical data and the reference data during a data read operation. The second common transistor is configured to apply a second power supply voltage to the other sense node out of the first sense node and the second sense node according to the first logical data and the second logical data or according to the first logical data and the reference data.

Embodiments will now be explained with reference to the accompanying drawings. The present invention is not limited to the embodiments.

The following embodiments are applicable to various types of memories such as a DRAM, a molecular memory, a NAND flash memory, a NOR flash memory, a BiCS (Bit Cost Scalable Memory), a TCAT (Terabit Cell Array Transistor) flash memory, an MRAM (Magnetic Random Access Memory), a PRAM or PCM (Phase-Change Random Access Memory), an interfacial PCM (iPCM), a ReRAM (Resistance Random Access Memory), an FeRAM (Ferroelectric Random Access Memory), an FeNAND, a DRAM FeRAM, a Chain FeRAM, and a Ladder FeRAM.

First Embodiment

Figure 1:
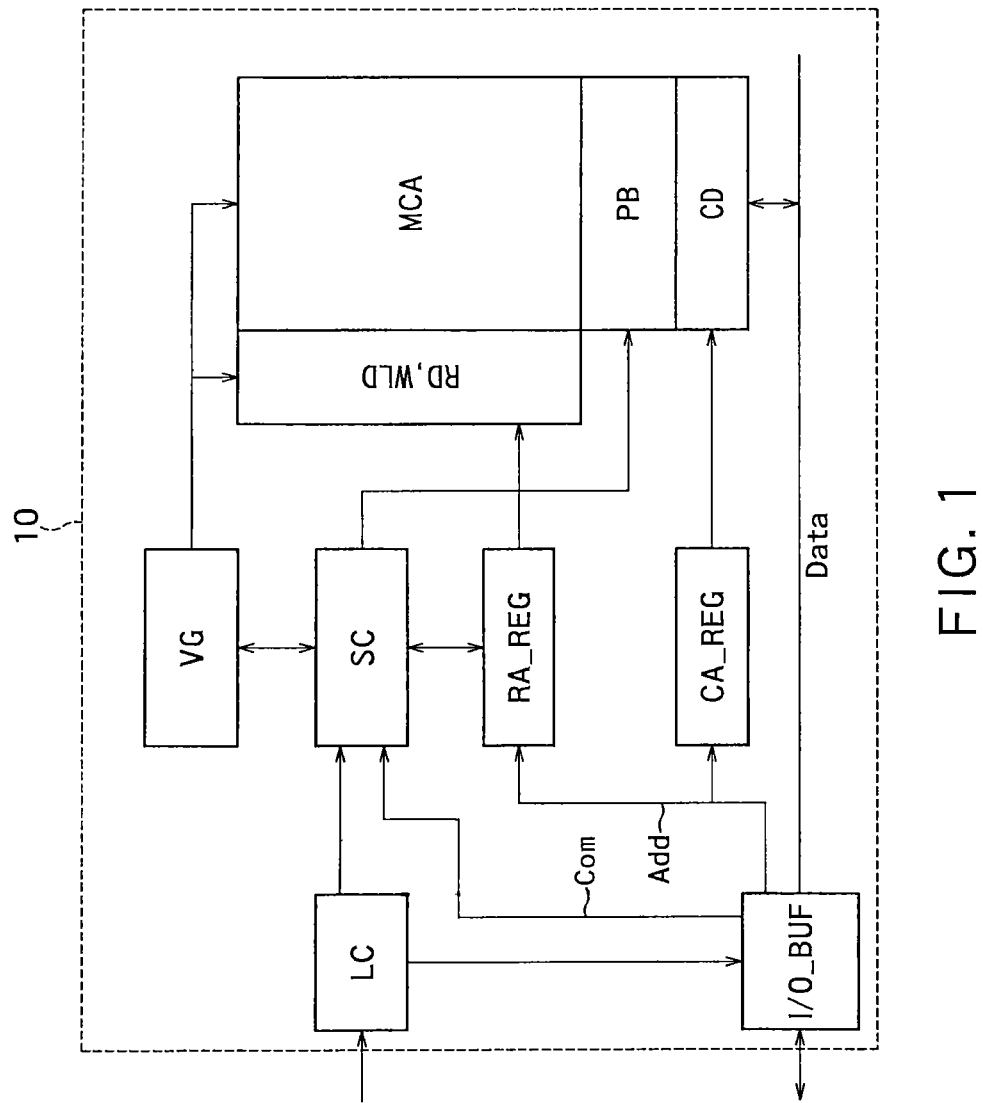
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a word line driver WLD, a row decoder RD, an internal-voltage generation circuit VG, a sequence controller SC, a logic controller LC, a row address register RA_REG, a column address register CA_REG, and an input/output buffer I/O_BUF. The internal-voltage generation circuit VG includes a step-up circuit that generates a higher potential than an external power supply potential VDD by a charge pump circuit, a source follower step-down transistor, a circuit that generates an internal step-down potential from the external power supply potential VDD by a PMOS-Feed-Back circuit, a BGR (Band-Gap-Reference) circuit serving as a reference-potential generation circuit that generates a constant potential irrespective of temperature and/or power supply voltages, and the like. While FIG. 1 clearly shows arrows indicating supply of the step-up potential to the memory cell array MCA, the row decoder RD, and the word line driver WLD, a step-down potential is also supplied to the page buffer PB, the column decoder CD, the sequence controller SC, the row address register RA_REG, and the column address register CA_REG.

The memory cell array MCA includes a plurality of memory cells MC arranged two-dimensionally in a matrix. The row decoder RD and the word line driver WLD selectively step up/drive some of word lines in the memory cell array MCA.

The column decoder CD and the page buffer PB read data stored in the memory cells MC via a selected bit line or selected pared bit lines and temporarily store the read data. Alternatively, the column decoder CD and the page buffer PB temporarily store write data and write the write data to the memory cells MC via the selected bit line or the paired bit lines. The page buffer PB includes a sense amplifier circuit and a data holding circuit and reads and writes data in units of pages on the memory cell array MCA. The column decoder CD transfers the read data stored in the page buffer PB to the I/O buffer I/O_BUF for every column. Alternatively, the column decoder CD transfers the write data transferred from the I/O buffer I/O_BUF to the page buffer PB for every column.

The row address register RA_REG receives a row address signal via the I/O buffer I/O_BUF and holds the received row address signal. The column address register CA_REG receives a column address signal via the I/O buffer I/O_BUF and holds the received column address signal. The row address register RA_REG and the column address register CA_REG transfer the row address signal and the column address signal (hereinafter, also "address signals Add") to the row decoder RD and the column decoder CD, respectively.

Based on control signals (hereinafter, also "commands Com") such as a chip enable signal, a command enable signal, an address latch enable signal, a write enable signal, and a read enable signal, the logic controller LC controls input of the command Com or the address signals Add, and also controls input and output of data Data (read data or write data). The memory 100 performs a data read operation or a data write operation according to the commands Corn. The sequence controller SC executes a read, write, or erasure sequence control in response to the commands Com.

The internal-voltage generation circuit VG generates/supplies predetermined voltages necessary for various operations under control of the sequence controller SC.

The I/O buffer I/O_BUF outputs the read data from the column decoder CD to outside or transfers the write data from outside to the column decoder CD. Furthermore, the I/O buffer I/O_BUF receives the commands Com and the address signals Add.

Figure 2:
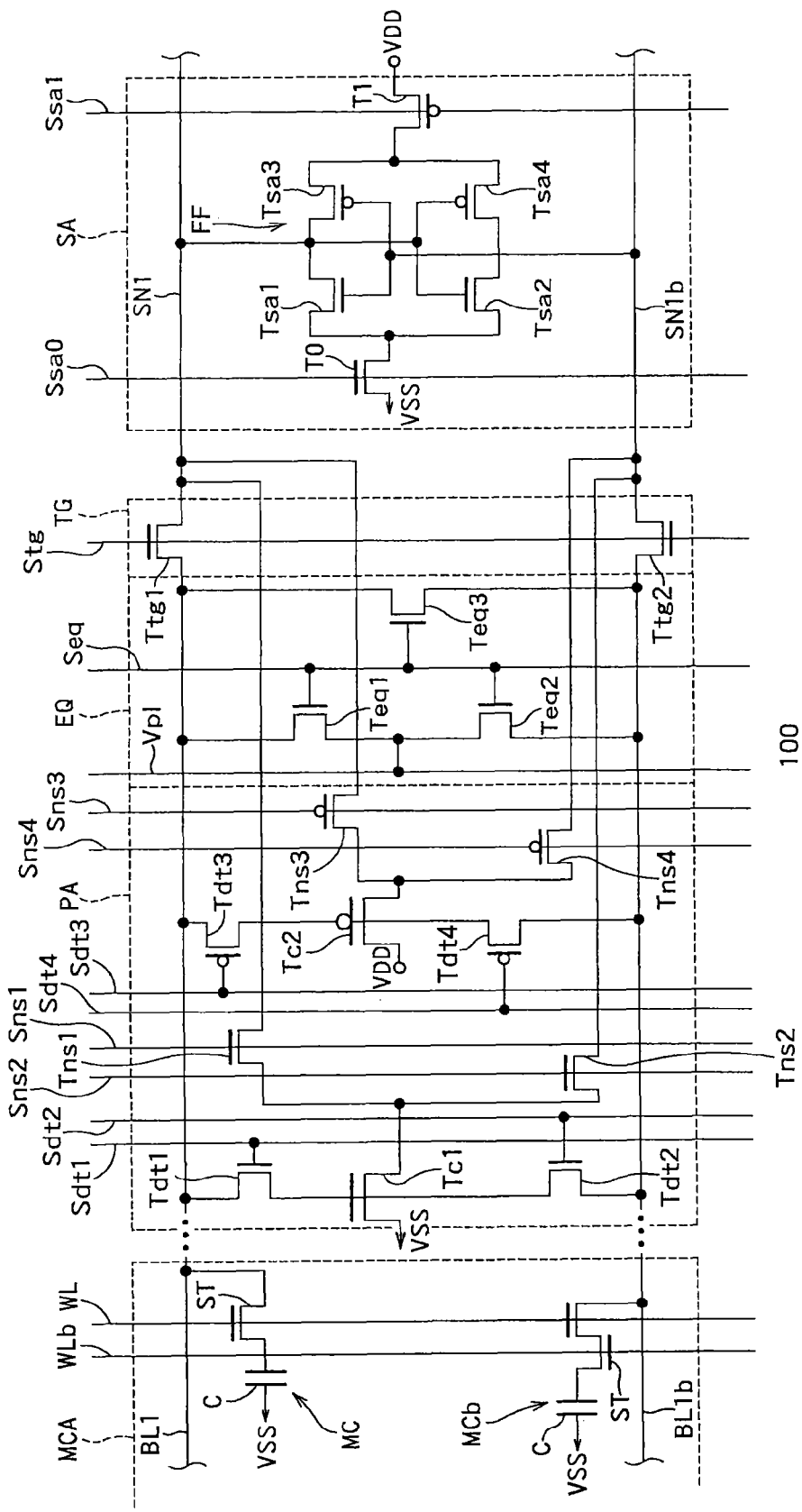
FIG. 2 is a circuit diagram showing an example of a configuration of the DRAM or the molecular memory 100 according to the first embodiment.

FIG. 2 is a circuit diagram showing an example of a configuration of the DRAM or the molecular memory 100 (hereinafter, also simply "memory 100") according to the first embodiment. The memory 100 includes a memory cell array MCA, a preamplifier PA, an equalization circuit EQ, a transfer gate circuit TG, and a sense amplifier SA. The preamplifier PA, the equalization circuit EQ, the transfer gate circuit TG, and the sense amplifier SA are included in the sense amplifier circuit in the page buffer PB shown in FIG. 1.

The memory cell array MCA includes a plurality of memory cells MC and MCb (a plurality of first memory cells MC and a plurality of second memory cells MCb) arranged two-dimensionally in a matrix. The first memory cells MC store therein, for example, first logical data. The second memory cells MCb store therein, for example, second logical data opposite in logic to the first logical data or reference data. That is, the memory cells MC and MCb store therein either mutually complementary memory cell data or memory cell data and reference data. Each of the memory cells MC and MCb includes a capacitor C and a selection transistor ST. The capacitor C accumulates therein charge as data. The selection transistor ST is inserted/connected between the capacitor C and a first bit line BL1 or a second bit line BL1b, and transmits data stored in the capacitor C to either the bit line BL1 or BL1b. The selection transistor ST of each memory cell MC is connected to the bit line BL1 and the selection transistor ST of each memory cell MCb is connected to the bit line BL1b. In this way, the memory cells MC and MCb are connected to the bit lines BL1 and BL1b, respectively. The memory cells MC and MCb are memory cells each including, for example, a paraelectric capacitor of a DRAM, and the molecular memory.

Gates of the selection transistors ST of the memory cells MC and MCb are connected to word lines WL and WLb, respectively. By applying a high level voltage (more specifically, a VPP that is a value equal to or higher than a sum of a power supply voltage VDD or an internal voltage VAA supplied to the memory cell array MCA and a threshold voltage Vth of the transistor ST) to the word line WL, the selection transistor ST of each memory cell MC is turned on and connects the capacitor C of the memory cell MC to the bit line BL1. By applying a high level voltage (more specifically, the VPP that is a value equal to or higher than the sum of the power supply voltage VDD or the internal voltage VAA supplied to the memory cell array MCA and the threshold voltage Vth of the transistor ST) to the word line WLb, the selection transistor ST of each memory cell MCb is turned on and connects the capacitor C of the memory cell MCb to the bit line BL1b. Although FIG. 2 shows only a pair of the memory cells MC and MCb, the memory cell array MCA generally includes many paired memory cells MC and MCb.

Each bit line BL1 is connected to a first sense node SN1 via a first transfer gate Ttg1. Each bit line BL1b is connected to a second sense node SN1b via a second transfer gate Ttg2. That is, the bit lines BL1 and BL1b are connected to the sense nodes SN1 and SN1b, respectively. Furthermore, the first transfer gate Ttg1 is inserted/connected between the bit line BL1 and the sense node SN1, and the second transfer gate Ttg2 is inserted/connected between the bit line BL1b and the sense node SN1*b*. The sense amplifier SA is inserted between the sense nodes SN1 and SN1*b*. The sense amplifier SA thereby detects a voltage difference between the sense nodes SN1 and SN1*b*, compares a voltage of the sense node SN1 with that of the sense node SN1*b*, and amplifies the voltage difference.

The preamplifier PA includes a first common transistor Tc1, a second common transistor Tc2, a first data transfer transistor Tdt1, a second data transfer transistor Tdt2, a first node selection transistor Tns1, a second node selection transistor Tns2, a third data transfer transistor Tdt3, a fourth data transfer transistor Tdt4, a third node selection transistor Tns3, and a fourth node selection transistor Tns4. The first common transistor Tc1, the first data transfer transistor Tdt1, the second data transfer transistor Tdt2, the first node selection transistor Tns1, and the second node selection transistor Tns2 are formed using N-transistors, respectively. The second common transistor Tc2, the third data transfer transistor Tdt3, the fourth data transfer transistor Tdt4, the third node selection transistor Tns3, and the fourth node selection transistor Tns4 are formed using P-transistors, respectively.

A source of the first common transistor Tc1 is connected to a low level voltage VSS serving as a first power supply voltage. A drain of the first common transistor Tc1 is connected to the sense node SN1 via the first node selection transistor Tns1 and connected to the sense node SN1*b* via the second node selection transistor Tns2. That is, the first node selection transistor Tns1 is connected between the first common transistor Tc1 and the sense node SN1. The second node selection transistor Tns2 is connected between the first common transistor Tc1 and the sense node SN1*b*.

A gate of the first common transistor Tc1 is connected to the bit line BL1 via the first data transfer transistor Tdt1 and connected to the bit line BL1*b* via the second data transfer transistor Tdt2. That is, the first data transfer transistor Tdt1 is inserted/connected between the gate of the first common transistor Tc1 and the bit line BL1. The second data transfer transistor Tdt2 is inserted/connected between the gate of the first common transistor Tc1 and the bit line BL1*b*.

In this way, the first common transistor Tc1 is shared between the paired bit lines BL1 and BL1*b*. Therefore, during a data read operation, the first common transistor Tc1 functions to connect the first power supply voltage VSS to the second sense node SN1*b* according to the data (first logical data) from the bit line BL1 while the voltage of the first logical data is reflected/amplified in the connection between the first power supply voltage VSS and the second sense node SN1*b*. Alternately, the first common transistor Tc1 functions to connect the first power supply voltage VSS to the first sense node SN1 according to the data (second logical data) from the bit line BL1*b* while the voltage of the second logical data is reflected/amplified in the connection between the first power supply voltage VSS and the first sense node SN1.

A relation that the two are mutually complementary or one serves as reference data of the other is held between the first logical data and the second logical data, and the first common transistor Tc1 is an N-transistor. Therefore, in a case where the first logical data and the second logical data are mutually complementary, the first common transistor Tc1 is turned on more strongly when receiving logical high (1) out of the first and second logical data and connects the first power supply voltage VSS to either the sense node SN1 or SN1*b* more strongly. The first common transistor Tc1 is turned off more strongly when receiving logical low (0) out of the first and second logical data and disconnects the first power supply voltage VSS from the other one of the sense nodes SN1 and SN1*b* more strongly. Therefore, the first common transistor Tc1 connects the first power supply voltage VSS to either the sense node SN1 or SN1*b* more strongly according to the first and second logical data although being shared between the bit lines BL1 and BL1*b*. In a case of using the first logical data and the reference data, the first common transistor Tc1 is turned on more strongly when receiving a higher voltage out of the first logical data and the reference data and connects the first power supply voltage VSS to either the sense node SN1 or SN1*b* more strongly. The first common transistor Tc1 is turned off more strongly when receiving a lower voltage out of the first logical data and the reference data and disconnects the first power supply voltage VSS from the other one of the sense nodes SN1 and SN1*b*. Therefore, the first common transistor Tc1 functions to connect the first power supply voltage VSS to either the sense node SN1 or SN1*b* more strongly according to the first logical data and the reference data although being shared between the bit lines BL1 and BL1*b*.

A source of the second common transistor Tc2 is connected to a high-level power supply voltage VDD serving as a second power supply voltage. A drain of the second common transistor Tc2 is connected to the sense node SN1 via the third node selection transistor Tns3 and connected to the sense node SN1*b* via the fourth node selection transistor Tns4. That is, the third node selection transistor Tns3 is inserted/connected between the second common transistor Tc2 and the sense node SN1. The fourth node selection transistor Tns4 is inserted/connected between the second common transistor Tc2 and the sense node SN1*b*.

A gate of the second common transistor Tc2 is connected to the bit line BL1 via the third data transfer transistor Tdt3 and connected to the bit line BL1*b* via the fourth data transfer transistor Tdt4. That is, the third data transfer transistor Tdt3 is inserted/connected between the gate of the second common transistor Tc2 and the bit line BL1. The fourth data transfer transistor Tdt4 is inserted/connected between the gate of the second common transistor Tc2 and the bit line BL1*b*.

In this way, similarly to the first common transistor Tc1, the second common transistor Tc2 is shared between the paired bit lines BL1 and BL1*b*. Therefore, during a data read operation, the second common transistor Tc2 functions to connect the second power supply voltage VDD to the second sense node SN1*b* more strongly according to the data (first logical data) from the bit line BL1 or functions to connect the second power supply voltage VDD to the first sense node SN1 more strongly according to the data (second logical data) from the bit line BL1*b*.

A relation that the two are mutually complementary or one serves as reference data of the other is held between the first logical data and the second logical data, and the second common transistor Tc2 is a P-transistor. Therefore, in the case where the first logical data and the second logical data are mutually complementary, the second common transistor Tc2 is turned on more strongly when receiving a logical low (0) out of the first and second logical data and connects the second power supply voltage VDD to either the sense node SN1 or SN1*b* more strongly. The second common transistor Tc2 is turned off more strongly when receiving a logical high (1) out of the first and second logical data and disconnects the second power supply voltage VDD from the other one of the sense nodes SN1 and SN1*b*. Therefore, the second common transistor Tc2 functions to connect the second power supply voltage VDD to either the sense node SN1 or SN1*b* more strongly according to the first and second logical data although being shared between the bit lines BL1 and BL1*b*.

In a case of using the first logical data and the reference data, the second common transistor Tc2 is turned on more strongly when receiving a lower voltage out of the first logical data and the reference data and connects the second power supply voltage VDD to either the sense node SN1 or SN1b more strongly. The second common transistor Tc2 is turned off more strongly when receiving a higher voltage out of the first logical data and the reference data and disconnects the second power supply voltage VDD from the other one of the sense nodes SN1 and SN1b. Therefore, the second common transistor Tc2 functions to connect the second power supply voltage VDD to either the sense node SN1 or SN1b more strongly according to the first logical data and the reference data although being shared between the bit lines BL1 and BL1b.

Signal lines Sdt1 to Sdt4 and Sns1 to Sns4 are connected to gates of the transistors Tdt1 to Tdt4 and Tns1 to Tns4, respectively and control the transistors Tdt1 to Tdt4 and Tns1 to Tns4 to be turned on/off, respectively.

The equalization circuit EQ includes equalization transistors Teq1 to Teq3. The equalization transistors Teq1 to Teq3 are formed using, for example, N-transistors, respectively. The equalization transistors Teq1 to Teq3 are provided to make a voltage of the bit line BL1 equal to that of the bit line BL1b and to make a voltage of the sense node SN1 equal to that of the sense node SN1b before data detection.

A signal line Seq is connected to gates of the transistors Teq1 to Teq3 and controls the transistors Teq1 to Teq3 to be turned on/off. A precharge voltage Vpl is connected to a node between the transistors Teq1 and Teq2 and maintained to the precharge voltage Vpl. The precharge voltage Vpl is a predetermined voltage applied to the bit lines BL1 and BL1b or the sense nodes SN1 and SN1b before data detection. The bit lines BL1 and BL1b and the sense nodes SN1 and SN1b are thereby equally precharged with the precharge voltage Vpl. The precharge voltage Vpl is, for example, a VDD or a VDD/2. In a case where a voltage supplied to the memory cell array MCA is an internal voltage VAA, the precharge voltage Vpl can be set to a VAA or a (½)×VAA. Furthermore, the precharge voltage Vpl is sometimes set to a ground voltage (first power supply voltage) VSS.

The transfer gate circuit TG includes the first transfer gate Ttg1 and the second transfer gate Ttg2. The transfer gates Ttg1 and Ttg2 are formed using, for example, N-transistors, respectively. As described above, the first transfer gate Ttg1 is inserted/connected between the bit line BL1 and the sense node SN1, and the second transfer gate Ttg2 is inserted/connected between the bit line BL1b and the sense node SN1b. The transfer gates Ttg1 and Ttg2 are turned off after data detection and disconnect the bit lines BL1 and BL1b from the sense nodes SN1 and SN1b, respectively. At a subsequent time of write-back or equalization of data, the transfer gates Ttg1 and Ttg2 are turned on and connect the bit lines BL1 and BL1b to the sense nodes SN1 and SN1b, respectively. A signal line Stg is connected to gates of the transfer gates Ttg1 and Ttg2 and controls the transfer gates Ttg1 and Ttg2 to be turned on/off. The transfer gate is in some cases referred to as "φT Gate".

The sense amplifier SA includes transistors Tsa1 to Tsa4 and power supply transistors T0 and T1. The transistors Tsa1, Tsa2, and T0 are generally formed using N-transistors, respectively. The transistors Tsa3, Tsa4, and T1 are generally formed using P-transistors, respectively. Signal lines Ssa0 and Ssa1 are connected to gates of the power supply transistors T0 and T1, respectively and control the power supply transistors T0 and T1 to be turned on/off, respectively. In the first embodiment, a most common F/F (flip-flop) sense amplifier is shown as the sense amplifier SA.

Gates of the transistors Tsa1 and Tsa3 are connected commonly to the sense node SN1b. A source of the transistor Tsa1 is connected to the first power supply voltage VSS of a lower potential (generally 0 [V]) via the power supply transistor T0. A source of the transistor Tsa3 is connected to the second power supply voltage VDD of a higher potential (generally the external power supply voltage VDD or an array-supplied internal voltage VAA) via the power supply transistor T1. Drains of the transistors Tsa1 and Tsa3 are connected commonly to the sense node SN1.

Gates of the transistors Tsa2 and Tsa4 are connected commonly to the sense node SN1. A source of the transistor Tsa2 is connected to the first power supply voltage VSS of a lower potential (generally 0 [V]) via the power supply transistor T0. A source of the transistor Tsa4 is connected to the second power supply voltage VDD of a higher potential (generally the external power supply voltage VDD or the array-supplied internal voltage VAA) via the power supply transistor T1. Drains of the transistors Tsa2 and Tsa4 are connected commonly to the sense node SN1b.

The transistors Tsa1 to Tsa4 thereby form a flip-flop F/F and latch the voltages of the sense nodes SN1 and SN1b.

Figure 3:
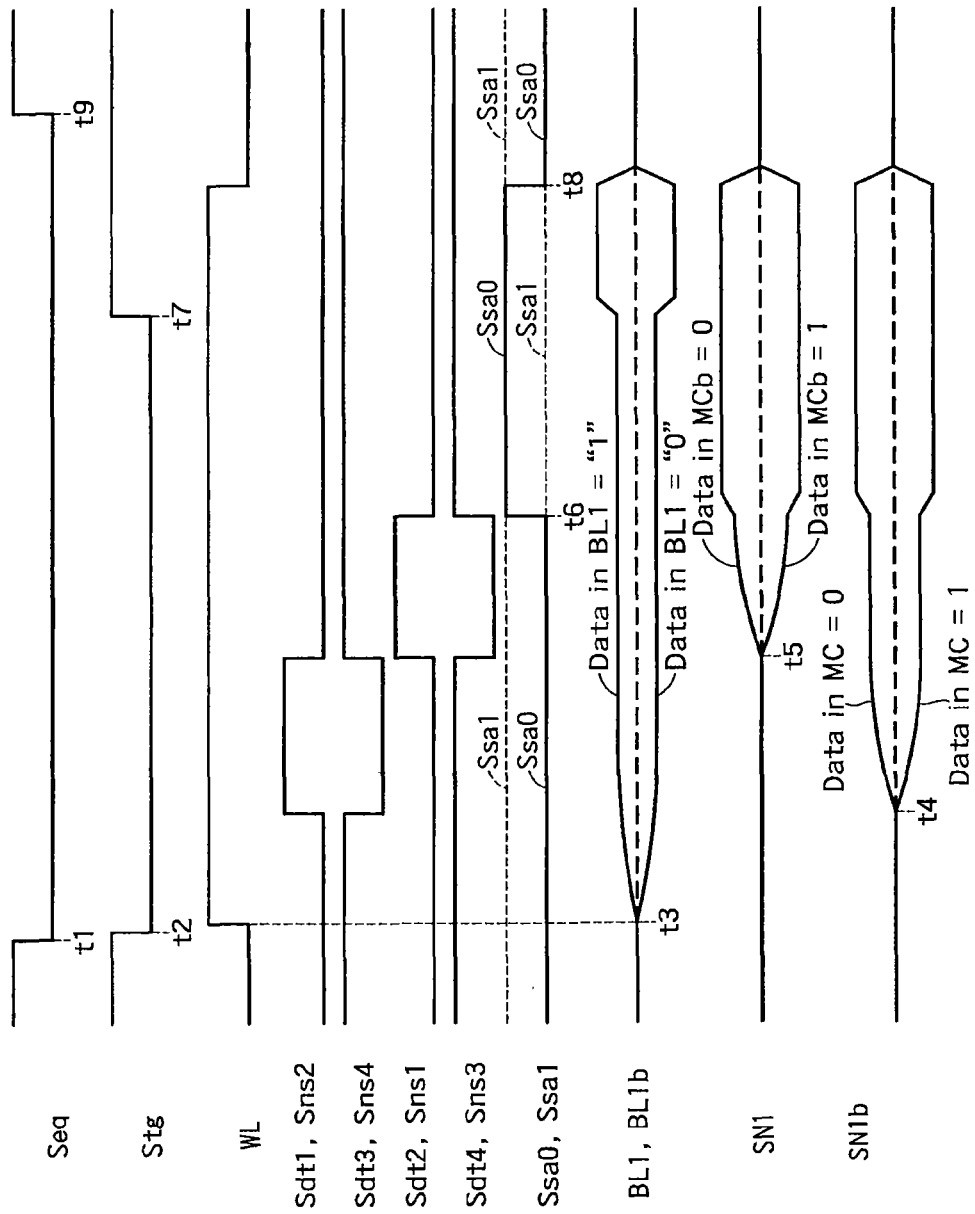
FIG. 3 is a timing chart showing an example of a data read operation performed by the memory 100 according to the first embodiment.

FIG. 3 is a timing chart showing an example of a data read operation performed by the memory 100 according to the first embodiment. With reference to FIG. 3, the data read operation performed by the memory 100 is explained. The data read operation performed by the memory 100 is explained while assuming that reference characters of the signal lines such as the Seq are those of signals propagated on the respective signal lines Seq and the like.

First, prior to start of the data read operation, the signals Seq and Stg are in states of logical high. The transfer gate circuit TG thereby connects the bit line BL1 to the sense node SN1 and connects the bit line BL1b to the sense node SN1b. Furthermore, the equalization circuit EQ equally precharges the bit lines BL1 and BL1b and the sense nodes SN1 and SN1b with a precharge voltage Vpl. At this time, the preamplifier PA and the sense amplifier SA are not operating.

At a time t1, when the data read operation starts, the signal Seq is lowered to logical low. The equalization circuit EQ thereby disconnects the precharge voltage Vpl from the bit lines BL1 and BL1b and the sense nodes SN1 and SN1b.

At a time t2, the signal Stg is lowered to logical low. The transfer gate circuit TG thereby disconnects the bit line BL1 from the sense node SN1 and disconnects the bit line BL1b from the sense node SN1b.

At a time t3, voltages of the selected paired word lines WL and WLb are stepped up. The selection transistors ST of the memory cells MC and MCb connected to the selected word lines WL and WLb are thereby turned on and the capacitors C of the memory cells MC and MCb are connected to the bit lines BL1 and BL1b, respectively. At this time, data stored in the memory cells MC and MCb is transmitted to the bit lines BL1 and BL1b, respectively. Therefore, after the time t3, a voltage difference (a signal difference) is generated between the bit lines BL1 and BL1b.

(Transfer of Inverted Data from BL1 to SN1b)

Next, at a time t4, the signals Sdt1 and Sns2 are raised to logical high and the signals Sdt3 and Sns4 are lowered to logical low. The data transfer transistors Tdt1 and Tdt3 and the node selection transistors Tns2 and Tns4 within the preamplifier PA are thereby turned on.

By turning on the first data transfer transistor Tdt1, the bit line BL1 is connected to the gate of the first common transistor Tc1. The first common transistor Tc1 is either turned on more strongly or turned off more strongly according to the data of the memory cell MC transmitted via the bit line BL1.

Furthermore, by turning on the second node selection transistor Tns2, the drain of the first common transistor Tc1 is connected to the sense node SN1b.

At this time, for example, when the data from the memory cell MC is logical high (1), the first common transistor Tc1 is turned on more strongly. Therefore, the first power supply voltage (low level voltage) VSS is connected to the sense node SN1b more strongly via the first common transistor Tc1 and the second node selection transistor Tns2. That is, the low level voltage VSS is connected to the sense node SN1b more strongly. On the other hand, when the data from the memory cell MC is logical low (0), the first common transistor Tc1 is turned off more strongly. Therefore, the first power supply voltage (low level voltage) VSS is in a state of being disconnected from the sense node SN1b more strongly. That is, the low level voltage VSS is connected to the sense node SN1b more weakly.

Moreover, by turning on the third data transfer transistor Tdt3, the bit line BL1 is connected to the gate of the second common transistor Tc2. The second common transistor Tc2 is either turned on more strongly or turned off more strongly according to the data from the memory cell MC transmitted via the bit line BL1. Furthermore, by turning on the fourth node selection transistor Tns4, a drain of the fourth common transistor Tc4 is connected to the sense node SN1b.

For example, when the data from the memory cell MC is logical low (0), the second common transistor Tc2 is turned on more strongly. Therefore, the second power supply voltage (high level voltage) VDD is connected to the sense node SN1b more strongly via the second common transistor Tc2 and the fourth node selection transistor Tns4. That is, the high level voltage VDD is connected to the sense node SN1b more strongly. On the other hand, when the data from the memory cell MC is logical high (1), the second common transistor Tc2 is turned off more strongly. Therefore, the second power supply voltage (high level voltage) VDD is in a state of being disconnected from the sense node SN1b more strongly. That is, the high level voltage VDD is connected to the sense node SN1b more weakly.

In this way, at the time t4, when the data obtained from the bit line BL1 is logical high (1), the preamplifier PA amplifies the data to a lower voltage (closer to the low level voltage VSS) and transmits the resultant data to the sense node SN1b. When the data obtained from the bit line BL1 is logical low (0), the preamplifier PA amplifies the data to a higher voltage (closer to the high level voltage VDD) and transmits the resultant data to the sense node SN1b. That is, the preamplifier PA inverts and amplifies the data from the bit line BL1 and transmits the inverted and amplified data to the sense node SN1b.

(Transfer of Inverted Data from BL1b to SN1)

After returning the signals Sdt1 and Sns2 to logical low and returning the signals Sdt3 and Sns4 to logical high, the signals Sdt2 and Sns1 are raised to logical high and the signals Sdt4 and Sns3 are lowered to logical low at a time t5. With this configuration, after the data transfer transistors Tdt1 and Tdt3 and the node selection transistors Tns2 and Tns4 within the preamplifier PA are turned off, the data transfer transistors Tdt2 and Tdt4 and the node selection transistors Tns1 and Tns3 are turned on at the time t5.

By turning on the second data transfer transistor Tdt2, the bit line BL1b is connected to the gate of the first common transistor Tc1. The first common transistor Tc1 is either turned on more strongly or turned off more strongly according to data from the memory cell MCb transmitted via the bit line BL1b. Furthermore, by turning on the first node selection transistor Tns1, the drain of the first common transistor Tc1 is connected to the sense node SN1.

At this time, for example, when the data from the memory cell MCb is logical high (1), the first common transistor Tc1 is turned on more strongly. Therefore, the first power supply voltage (low level voltage) VSS is connected to the sense node SN1 more strongly via the first common transistor Tc1 and the first node selection transistor Tns1. That is, the low level voltage VSS is connected to the sense node SN1 more strongly. On the other hand, when the data from the memory cell MCb is logical low (0), the first common transistor Tc1 is turned off more strongly. Therefore, the first power supply voltage (low level voltage) VSS is in a state of being disconnected from the sense node SN1 more strongly. That is, the low level voltage VSS is connected to the sense node SN1 more weakly.

Moreover, by turning on the fourth data transfer transistor Tdt4, the bit line BL1b is connected to the gate of the second common transistor Tc2. The second common transistor Tc2 is either turned on more strongly or turned off more strongly according to the data from the memory cell MCb transmitted via the bit line BL1b. Furthermore, by turning on the third node selection transistor Tns3, the drain of the fourth common transistor Tc4 is connected to the sense node SN1.

For example, when the data from the memory cell MCb is logical low (0), the second common transistor Tc2 is turned on more strongly. Therefore, the second power supply voltage (high level voltage) VDD is connected to the sense node SN1 more strongly via the second common transistor Tc2 and the third node selection transistor Tns3. That is, the high level voltage VDD is connected to the sense node SN1 more strongly. On the other hand, when the data from the memory cell MCb is logical high (1), the second common transistor Tc2 is turned off more strongly. Therefore, the second power supply voltage (high level voltage) VDD is in a state of being disconnected from the sense node SN1 more strongly. That is, the high level voltage VDD is connected to the sense node SN1 more weakly.

In this way, at the time t5, when the data obtained from the bit line BL1b is logical high (1), the preamplifier PA transmits the data at a lower voltage (closer to the low level voltage VSS) to the sense node SN1. When the data obtained from the bit line BL1 is logical low (0), the preamplifier PA transmits the data at a higher voltage (closer to the high level voltage VDD) to the sense node SN1. That is, the preamplifier PA inverts and amplifies the data from the bit line BL1b and transmits the inverted and amplified data to the sense node SN1.

As described above, by transferring the inverted data from the bit line BL1 to the sense node SN1b at the time t4 and transferring the inverted data from the bit line BL1b to the sense node SN1 at the time t5, the preamplifier PA consequently amplifies the data and transfers the data from the bit line BL1 to the sense node SN1 in a non-inverted state, and amplifies the data and transfers the data from the bit line BL1b to the sense node SN1b in a non-inverted state. In the above example, the complementary data is transmitted from the bit lines BL1 and BL1b, respectively. However, the same holds true for a case where the data from either the bit line BL1 or BL1b is the reference data on the data from the other bit line. A voltage of the reference data is set to an intermediate voltage value between that of data "1" and that of data "0". Therefore, for example, when the data "1" is read to the bit line BL1 and the reference data is read to the bit line BL1b, a potential of the bit line BL1 is higher than that of the bit line BL1b. Therefore, the preamplifier PA preamplifies the potential of the bit line BL1 to a higher potential and transmits the data at the lower potential to the sense node. Furthermore, for example, when the data "0" is read to the bit line BL1 and the reference data is read to the bit line BL1b, the potential of the bit line BL1 is lower than that of the bit line BL1b. Therefore, the preamplifier PA preamplifies the potential of the bit line BL1 to a lower potential and transmits the data at the lower potential to the sense node. The first embodiment is intended to prevent the sense node SN1 or SN1b from erroneously determining a logical level as "High" or "Low" at the time of comparison and amplification by allowing one transistor Tc1 (or Tc2) to make preamplification. The sense amplifier SA is configured to include the paired PMOS (Tsa3 and Tsa4) and the paired NMOS (Tsa1 and Tsa2). Therefore, when an irregularity is present between the paired transistors (Tsa3 and Tsa4 or Tsa1 and Tsa2), data is erroneously read. In contrast, because the preamplifier PA according to the first embodiment performs the preamplification using one transistor Tc1 (or Tc2), it is not necessary at all to consider the possible irregularity between the paired transistors at the preamplification stage.

The preamplifier PA shifts the timing (the time t4) of transferring the inverted data from the bit line BL1 to the sense node SN1b from the timing (the time t5) of transferring the inverted data from the bit line BL1b to the sense node SN1. That is, the preamplifier PA makes the timing of applying either the power supply voltage VSS or VDD to the sense node SN1b different from that of applying the other power supply voltage to the sense node SN1. The paired sense nodes SN1 and SN1b (or the paired bit lines BL1 and BL1b) can share the first common transistor Tc1 connecting the power supply voltage VSS and share the second common transistor Tc2 connecting the power supply voltage VDD.

Next, at a time t6, the signal Ssa0 is raised to logical high and the signal Ssa1 is lowered to logical low. The sense amplifier SA thereby operates, compares, and amplifies the data on the sense node SN1 and that on the sense node SN1b, and latches the voltages of the sense nodes SN1 and SN1b at full amplitude.

For example, when the data on the sense node SN1 is logical high (1) and that on the sense node SN1b is logical low (0), the transistors Tsa2 and Tsa3 in the flip-flop F/F are turned on and the transistors Tsa1 and Tsa4 are turned off. The first power supply voltage (low level voltage) VSS is thereby applied to the sense node SN1b via the transistors T0 and Tsa2. The second power supply voltage (high level voltage) VDD is thereby applied to the sense node SN1 via the transistors T1 and Tsa3. That is, the sense amplifier SA latches the data on the sense node SN1 to logical high (1) and latches that on the sense node SN1b to logical low (0). This latched state is maintained in a period (t6 to t8) in which the signal Ssa0 is logical high and in which the signal Ssa1 is logical low. Conversely, when the data on the sense node SN1 is logical low (0) and that on the sense node SN1b is logical high (1), the sense amplifier SA latches the data on the sense node SN1 to logical low (0) and latches that on the sense node SN1b to logical high (1). As needed, the memory 100 outputs the data to outside in this latched period.

Next, at a time t7, the signal Stg is raised to logical high. The transfer gate circuit TG thereby connects the bit line BL1 to the sense node SN1 and connects the bit line BL1b to the sense node SN1b. The data latched by the sense amplifier SA is thereby written back to the memory cells MC and MCb via the sense nodes SN1 and SN1b and the bit lines BL1 and BL1b. As described above, the data from the bit line BL1 is transferred to the sense node SN1 in a non-inverted state and the data from the bit line BL1b is transferred to the sense node SN1b in a non-inverted state. Therefore, it is possible to write back the data latched to the sense nodes SN1 and SN1b to the memory cells MC and MCb via the bit lines BL1 and BL1b as it is in the non-inverted state.

Next, at a time t8, the signal Ssa0 is lowered to logical low and the signal Ssa1 is raised to logical high. The sense amplifier SA thereby ends a latch operation. Just before the end of the latch operation, the level of the selected word line WL is also lowered. The bit lines BL1 and BL1b are thereby disconnected from the capacitors C of the memory cells MC and MCb, respectively.

Next, at a time t9, the signal Seq is lowered to logical high. At this time, the equalization circuit EQ equally precharges the bit lines BL1 and BL1b and the sense nodes SN1 and SN1b with the precharge voltage Vpl. The memory 100 thereby ends the data read operation.

According to the first embodiment, the transistor that connects the first power supply voltage VSS to the sense node SN1 or SN1b according to the data stored in the memory cells MC and MCb is constituted by a single first common transistor Tc1. The transistor that connects the second power supply voltage VDD to the sense node SN1 or SN1b according to the data stored in the memory cells MC and MCb is similarly constituted by the single second common transistor Tc2. In other words, the paired sense nodes SN1 and SN1b share the first common transistor Tc1 connecting the power supply voltage VSS and share the second common transistor Tc2 connecting the power supply voltage VDD.

Generally, the read voltage from memory cells lowers to follow the downscaling and higher integration of the memory. This makes a signal difference between the mutually complementary data (or between the memory cell data and the reference cell data) further smaller. Under such circumstances, when the sense amplifier is configured so that paired transistors receive the data stored the memory cells, the sense amplifier SA sometimes erroneously detects data logic because of the irregularity in the threshold voltage between the paired transistors.

In contrast, in the memory 100 according to the first embodiment, the common transistors Tc1 and Tc2 receiving the data stored in the memory cell Mc are provided one by one, respectively and provided commonly to (shared between) the paired bit lines BL1 and BL1b. Thus, the single first common transistor Tc1 serves as both a transistor connecting the low level voltage VSS to the sense node SN1 and as a transistor connecting the low level voltage VSS to the sense node SN1b and is provided commonly to (shared between) the sense nodes SN1 and SN1b. Furthermore, the single second common transistor Tc2 serves as both a transistor applying the high level voltage VDD to the sense node SN1 and as a transistor applying the high level voltage VDD to the sense node SN1b and is provided commonly to (shared between) the sense nodes SN1 and SN1b. As a result, even when the signal difference between the data stored in the memory cell MC and that stored in the memory cell MCb becomes smaller to follow the downscaling of the memory 100, the preamplifier PA and the sense amplifier SA can accurately detect the data stored in the memory cells MC and MCb.

First Modification of First Embodiment

Figure 4:
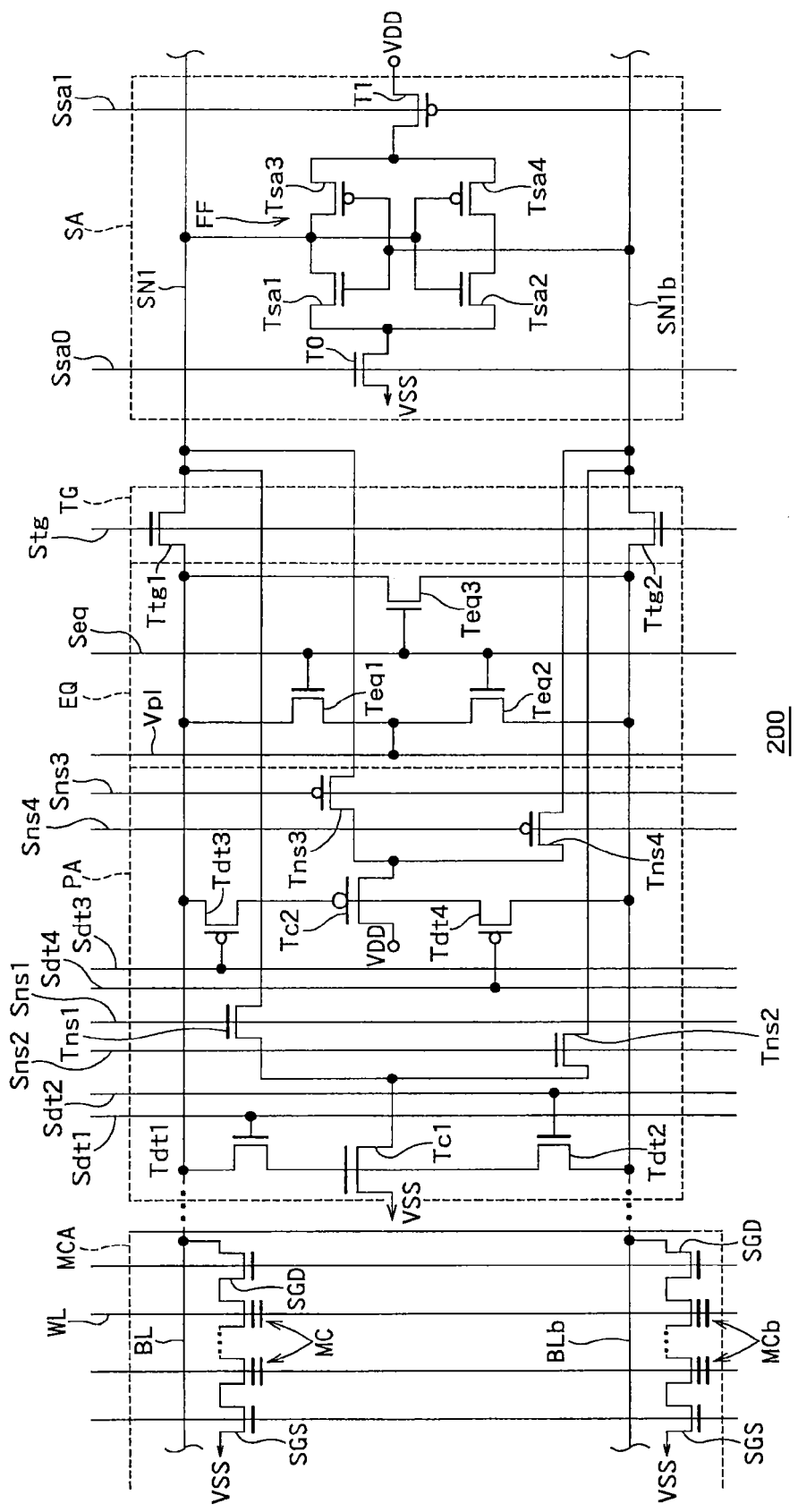
FIG. 4 is a circuit diagram showing an example of a configuration of a NAND flash memory 200 according to a first modification of the first embodiment.

FIG. 4 is a circuit diagram showing an example of a configuration of a NAND flash memory 200 (hereinafter, also simply "memory 200") according to a first modification of the first embodiment. The first modification differs from the first embodiment in that the memory cell array MCA is that for a NAND flash memory. Other configurations of the first modification can be identical to corresponding configurations of the first embodiment. Therefore, the respective configurations of the preamplifier PA, the equalization circuit EQ, the transfer gate circuit TG, and the sense amplifier SA of the first modification can be identical to those of the first embodiment.

The memory 200 includes a plurality of NAND strings within the memory cell array MCA. Each NAND string includes a plurality of memory cells MC (or MCb) connected in series and two selection gates SGS and SGD connected to both ends of the series-connected memory cells MC (or MCb), respectively. The selection gate SGS on a source side is connected to the power supply voltage VSS (generally a ground level of 0 [V]) and the selection gate SGD on a drain side is connected to a bit line BL or BLb. The number of memory cells MC (or MCb) included in each NAND NS string is not limited to a specific number. For example, the number of memory cells MC (or MCb) included in each NAND string can be set to 4, 8, 16, and so on.

For example, it suffices to define that the memory cells MC are memory cells storing logical data and that the memory cells MCb are reference cells storing the reference data. In this case, because it suffices to provide one MCb for a plurality of memory cells MC, each memory cell MC stores therein one logical data.

The data read operation according to the first modification differs from that according to the first embodiment in the operation performed in the memory cell array MCA. However, the respective operations of the preamplifier PA, the equalization circuit EQ, the transfer gate circuit TG, and the sense amplifier SA operate can be identical to those according to the first embodiment. However, the NAND flash memory is a memory (a nondestructive read memory) that does not destroy the data stored in the memory cells by reading the data therefrom differently from the DRAM and a molecular memory. Furthermore, this memory is a memory recognizing between "1" and "0" based on whether the bit line potential is eased by reflecting quantity of electrons accumulated in the floating gate on the threshold voltage, but not a memory recognizing between "1" and "0" based on quantity of charges released from a bit line through a memory cell as per a DRAM, a molecular memory, FeRAM and the like. Furthermore, the memory 200 according to the first modification can achieve effects identical to those of the first embodiment.

Second Modification of First Embodiment

Figure 5:
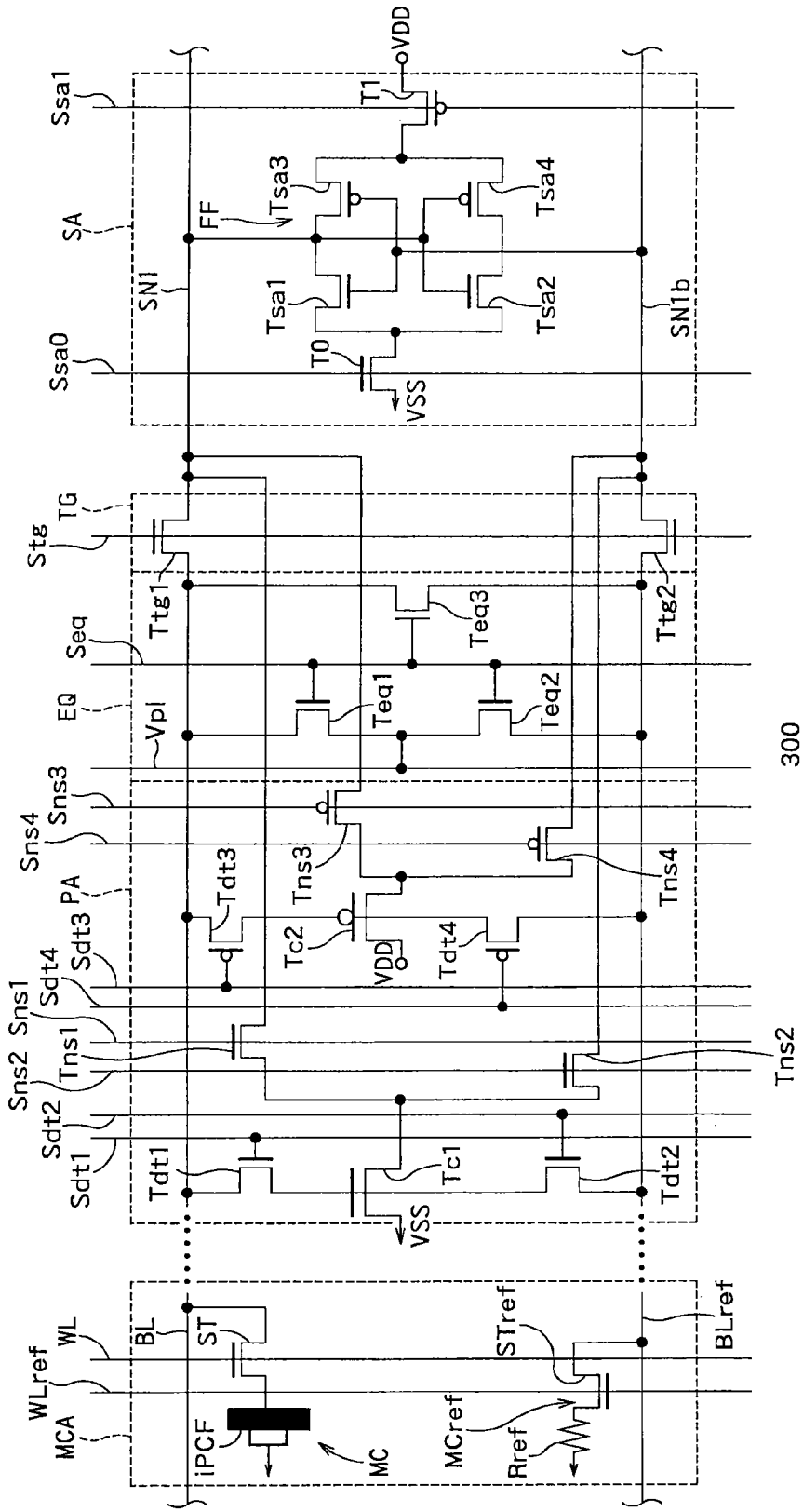
FIG. 5 is a circuit diagram showing an example of a configuration of a PCM 300 according to a second modification of the first embodiment.

FIG. 5 is a circuit diagram showing an example of a configuration of a PCM 300 (hereinafter, also simply "memory 300") according to a second modification of the first embodiment. The second modification differs from the first embodiment and the first modification in that the memory cell array MCA is that for a PCM (Phase-change Memory). Other configurations of the second modification can be identical to corresponding configurations of the first embodiment. Therefore, the respective configurations of the preamplifier PA, the equalization circuit EQ, the transfer gate circuit TG, and the sense amplifier SA of the second modification can be identical to those of the first embodiment.

The memory 300 includes a plurality of PCM memory cells MC within the memory cell array MCA. Each of the PCM memory cells MC serving as first memory cells includes a phase-change film PCF and the selection transistor ST. The selection transistor ST is connected between the phase-change film PCF and the first bit line BL and can transmit data according to a resistance of the phase-change film PCF to the bit line BL. A gate of the selection transistor ST is connected to one word line WL.

One reference cell MCref is provided commonly to a plurality of memory cells MC. The reference cell MCref serving as a second memory cell includes a reference resistor Rref and a reference cell transistor STref. The reference cell transistor STref is inserted/connected between the reference resistor Rref and a reference bit line BLref, and transmits data (reference data) according to a resistance of the reference resistor Rref to the reference bit line BLref. It suffices to set the resistance of the reference resistor Rref to substantially an intermediate value between the resistance of the phase-change film PCF storing data "1" and that of the phase-change film PCF storing data "0". With this setting, the data (first logical data) stored in each memory cell MC can be detected by comparing the first logical data with the reference data serving as the second logical data. A gate of the reference cell transistor STref is connected to one reference word line WLref.

The reference cell MCref is connected to the reference bit line BLref. One reference bit line BLref is provided commonly to a plurality of bit lines BL.

The data read operation according to the second modification differs from that according to the first embodiment in the operation performed in the memory cell array MCA. However, the respective operations of the preamplifier PA, the equalization circuit EQ, the transfer gate circuit TG, and the sense amplifier SA can be identical to those according to the first embodiment.

In the second modification, the data from the bit line BL is compared with the reference data from the reference bit line BLref. Therefore, it may be considered to replace "BL1" and "BL1b" shown in FIG. 3 by "BL" and "BLref". Furthermore, the PCM is a nondestructive read memory. Therefore, the memory 300 according to the second modification does not need to perform a write-back operation in a period from the time t7 to the time t8 shown in the timing chart of FIG. 3. The memory 300 according to the second modification can achieve effects identical to those of the first embodiment.

Third Modification of First Embodiment

Figure 6:
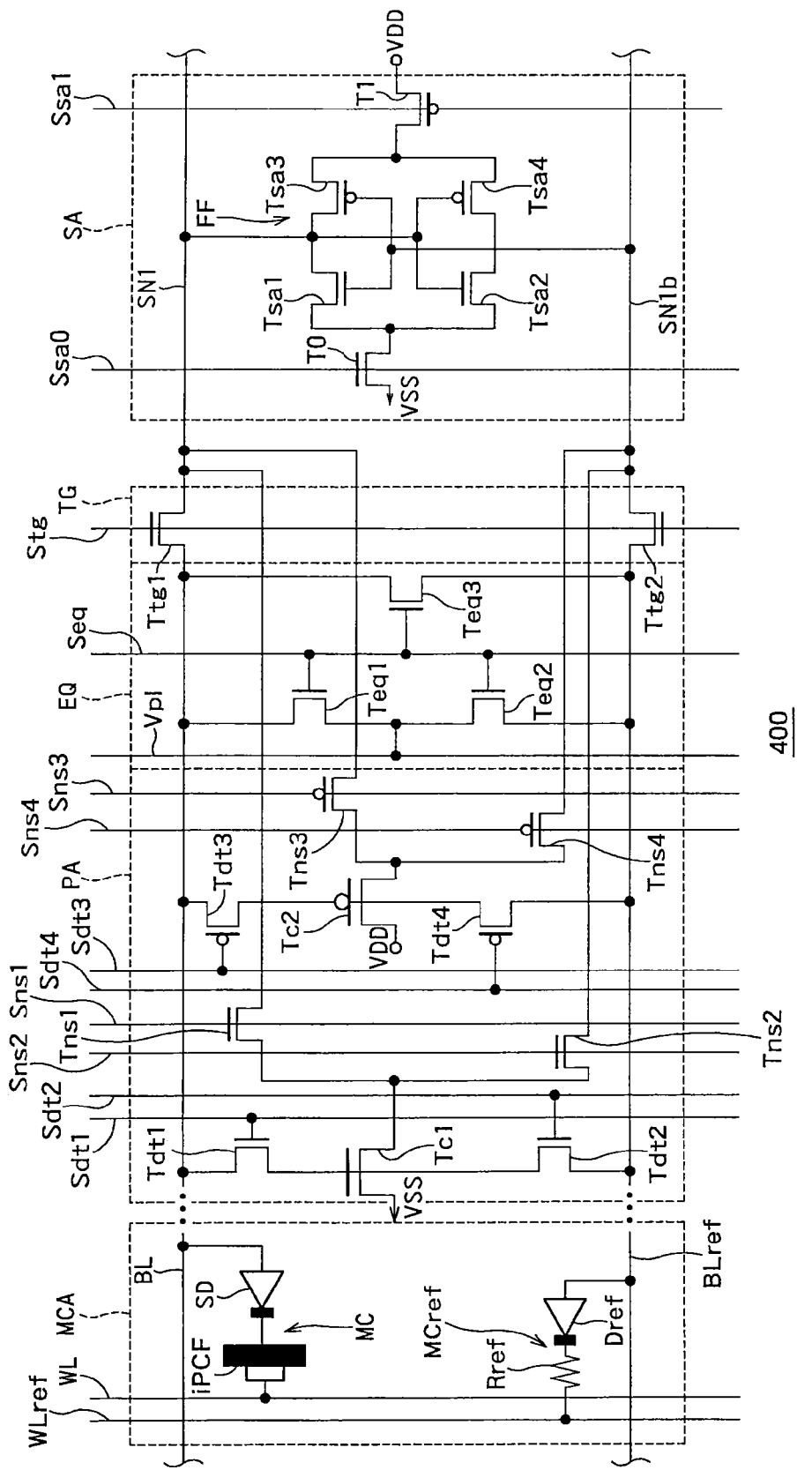
FIG. 6 is a circuit diagram showing an example of a configuration of an iPCM 400 according to a third modification of the first embodiment.

FIG. 6 is a circuit diagram showing an example of a configuration of an iPCM 400 (hereinafter, also simply "memory 400") according to a third modification of the first embodiment. The third modification differs from the first embodiment in that the memory cell array MCA is that for an iPCM. Other configurations of the third modification can be identical to corresponding configurations of the first embodiment. Therefore, the respective configurations of the preamplifier PA, the equalization circuit EQ, the transfer gate circuit TG, and the sense amplifier SA of the third modification can be identical to those of the first embodiment.

The memory 400 includes a plurality of iPCM memory cells MC within the memory cell array MCA. Each of the iPCM memory cells MC serving as a first memory cells includes a phase-change film iPCF and a selection diode SD. The phase-change film iPCF is connected between the selection diode SD and one word line WL, and the selection diode SD is inserted/connected between the phase-change film iPCF and one first bit line BL.

The word line WL can be selected by decreasing the voltage of the word line WL. For example, it is assumed that a voltage equal to or higher than a built-in potential (Vbi) of the selection diode SD is applied to the selection diode SD by a decrease in the voltage of the word line WL. At this time, a current flows from the first bit line BL to the phase-change film iPCF via the selection diode SD. At this time, data according to the resistance of the phase-change film iPCF is transmitted to the first bit line BL.

In the third modification, similarly to the second modification, one reference cell MCref is provided commonly to a plurality of memory cells MC. The reference cell MCref is configured so that a reference resistor Rref and a reference diode Dref are connected in series. The reference resistor Rref is connected between the reference diode Dref and one reference word line WLref, and the reference diode Dref is inserted/connected between the reference resistor Rref and one reference bit line BLref.

The reference cell MCref is connected to the reference bit line BLref. One reference bit line BLref is provided commonly to a plurality of bit lines BL.

It is assumed that the voltage equal to or higher than the built-in potential (Vbi) of the reference diode Dref is applied to the reference diode Dref by decreasing the voltage of the reference word line WLref. At this time, a current flows from the reference bit line BLref to the reference resistor Rref via the reference diode Dref. The data (reference data) according to the resistance of the reference resistor Rref can be thereby transmitted to the reference bit line BLref. Similarly to the second modification, it suffices to set the resistance of the reference data to substantially an intermediate value between the resistance of the phase-change film iPCF storing data "1" and that of the phase-change film iPCF storing data "0". With this setting, the preamplifier PA and the sense amplifier SA can detect the data (first logical data) stored in each memory cell MC by comparing the first logical data with the reference data serving as the second logical data.

The data read operation according to the third modification differs from that according to the first embodiment in the operation performed in the memory cell array MCA. However, the respective operations of the preamplifier PA, the equalization circuit EQ, the transfer gate circuit TG, and the sense amplifier SA can be identical to those according to the first embodiment.

In the third modification, data from the bit line BL is compared with the reference data from the reference bit line BLref. Therefore, it suffices to replace "BL1" and "BL1b" shown in FIG. 3 by "BL" and "BLref". Furthermore, the iPCM is a nondestructive read memory. Therefore, the memory 400 according to the third modification does not need to perform a write-back operation in a period from the time t7 to the time t8 shown in the timing chart of FIG. 3. The memory 400 according to the third modification can achieve effects identical to those of the first embodiment.

Fourth Modification of First Embodiment

Figure 7:
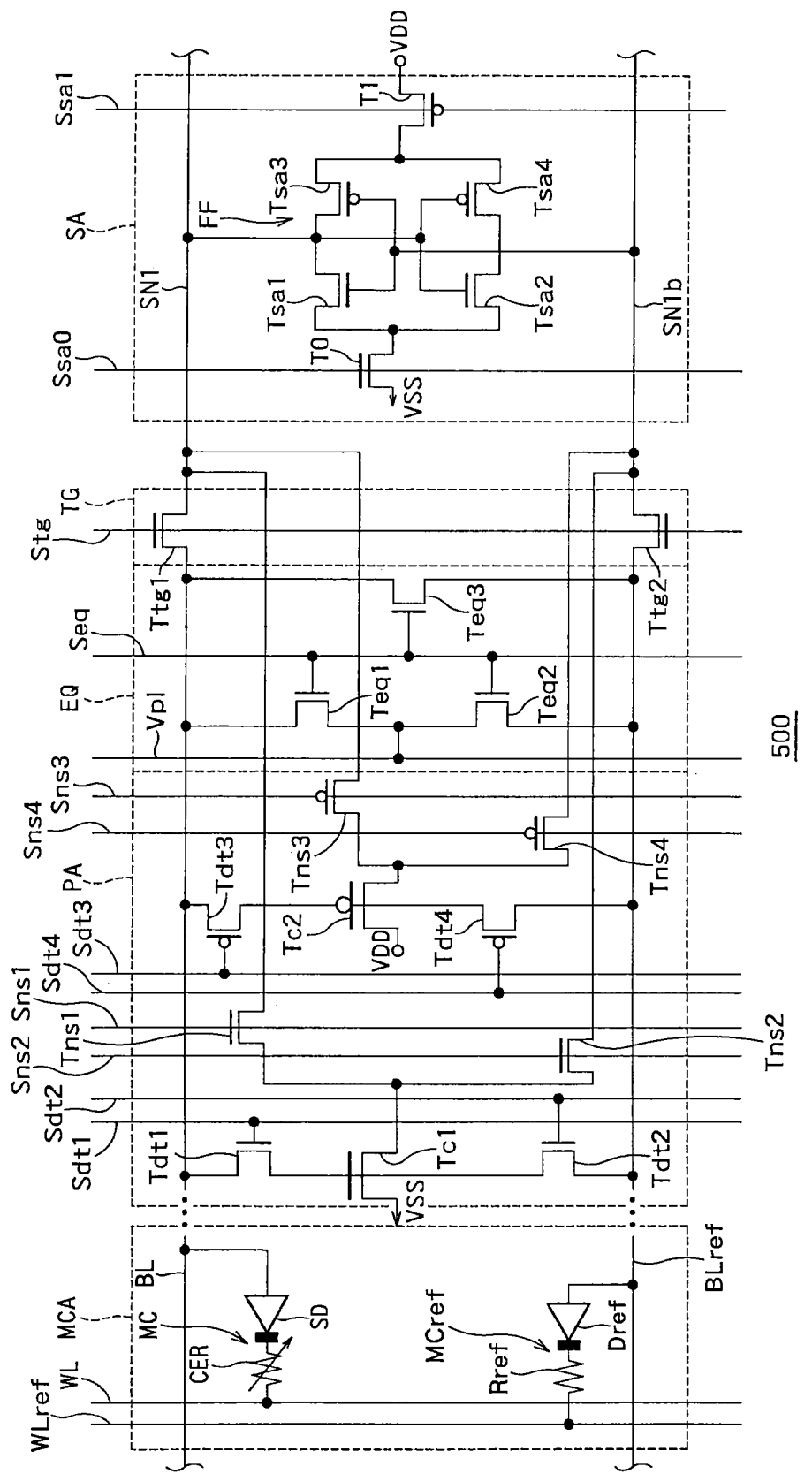
FIG. 7 is a circuit diagram showing an example of a configuration of a ReRAM 500 according to a fourth modification of the first embodiment.

FIG. 7 is a circuit diagram showing an example of a configuration of a ReRAM 500 (hereinafter, also simply "memory 500") according to a fourth modification of the first embodiment. The fourth modification differs from the first embodiment in that the memory cell array MCA is that for a ReRAM. Other configurations of the fourth modification can be identical to corresponding configurations of the first embodiment. Therefore, the respective configurations of the preamplifier PA, the equalization circuit EQ, the transfer gate circuit TG, and the sense amplifier SA of the fourth modification can be identical to those of the first embodiment.

The memory 500 includes a plurality of memory cells MC within the memory cell array MCA. Each of the memory cells MC serving as a first memory cells includes a resistance-change element CER and a selection diode SD. The resistance-change element CER is connected between the selection diode SD and one word line WL, and the selection diode SD is connected between the resistance-change element CER and one first bit line BL.

The word line WL can be selected by decreasing the voltage of the word line WL. For example, it is assumed that a voltage equal to or higher than the built-in potential (Vbi) of the selection diode SD is applied to the selection diode SD by the decrease in the voltage of the word line WL. At this time, a current flows from the first bit line BL to the resistance-change element CER via the selection diode SD. At this time, data according to a resistance of the resistance-change element CER is transmitted to the first bit line BL.

In the fourth modification, similarly to the second modification, one reference cell MCref is provided commonly to a plurality of memory cells MC. The reference cell MCref serving as a second memory cell includes the reference resistor Rref and the reference diode Dref. The reference resistor Rref is connected between the reference diode Dref and one reference word line WLref, and the reference diode Dref is connected between the reference resistor Rref and one reference bit line BLref.

The reference cell MCref is connected to the reference bit line BLref. One reference bit line BLref is provided commonly to a plurality of bit lines BL.

A voltage equal to or higher than the built-in potential (Vbi) of the reference diode Dref is applied to the reference diode Dref by decreasing the voltage of the reference word line WLref. At this time, a current flows from the reference bit line BLref to the reference resistor Rref via the reference diode Dref. Data (reference data) according to the resistance of the reference resistor Rref is thereby transmitted to the reference bit line BLref. Similarly to the second modification, it suffices to set the resistance of the reference data to substantially an intermediate value between the resistance of the resistance-change element CER storing data "1" and that of the resistance-change element CER storing data "0". With this setting, the preamplifier PA and the sense amplifier SA can detect the data (first logical data) stored in each memory cell MC by comparing the first logical data with the reference data serving as the second logical data.

The data read operation according to the fourth modification differs from that according to the first embodiment in the operation performed in the memory cell array MCA. However, the respective operations of the preamplifier PA, the equalization circuit EQ, the transfer gate circuit TG, and the sense amplifier SA can be identical to those according to the first embodiment.

In the fourth modification, the data from the bit line BL is compared with the reference data from the reference bit line BLref. Therefore, it may be considered to replace "BL1" and "BL1b" shown in FIG. 3 by "BL" and "BLref". Furthermore, the ReRAM is a nondestructive read memory. Therefore, the memory 500 according to the fourth modification does not need to perform the write-back operation in the period from the time t7 to the time t8 shown in the timing chart of FIG. 3. Furthermore, this memory is a memory recognizing between "1" and "0" based on whether the bit line potential is eased by reflecting a phase change on a resistance voltage, but not a memory recognizing between "1" and "0" based on quantity of charges released from a bit line through a memory cell as per a DRAM, a molecular memory, FeRAM and the like. The memory 500 according to the fourth modification can achieve effects identical to those of the first embodiment.

Fifth Modification of First Embodiment

Figure 8:
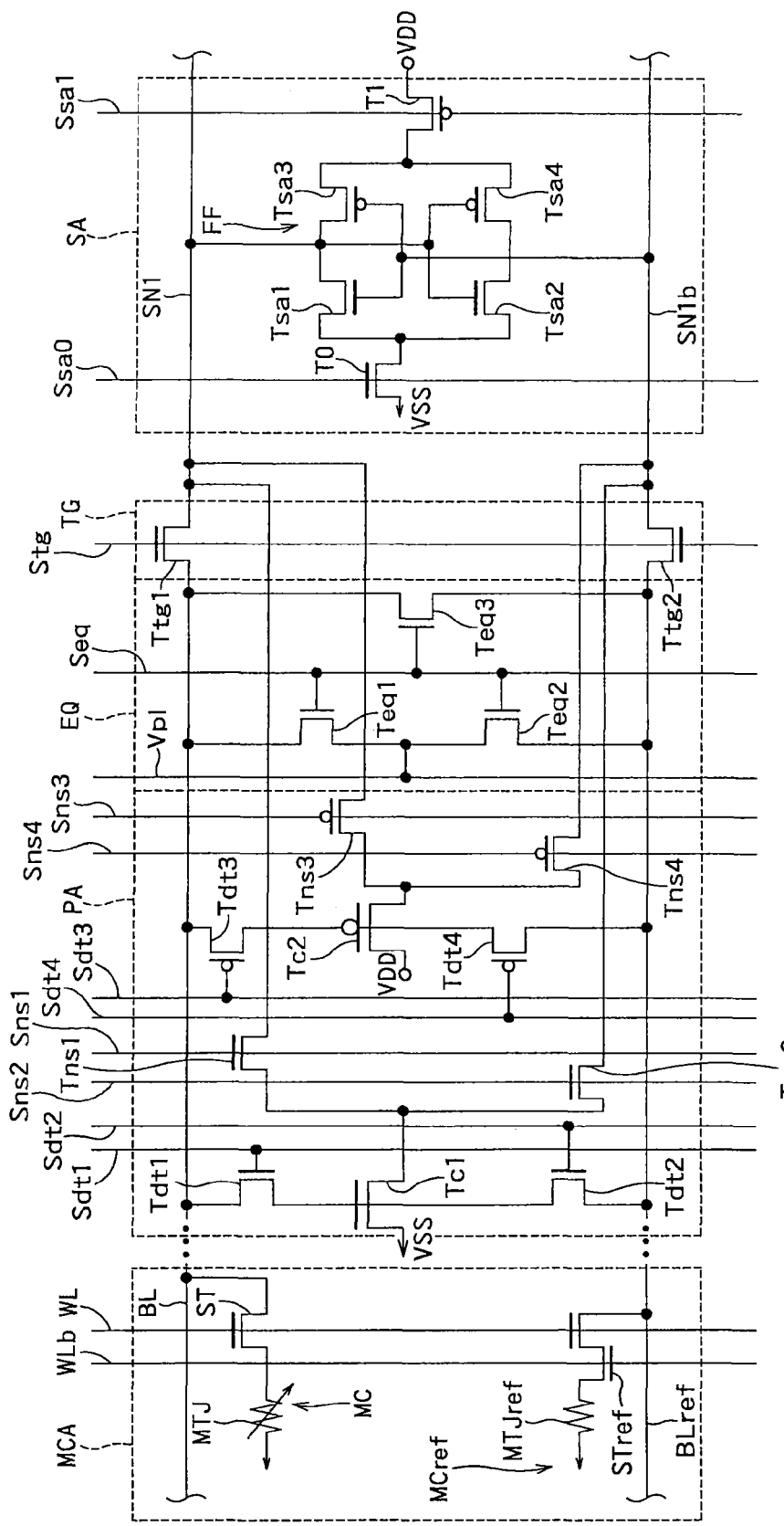
FIG. 8 is a circuit diagram showing an example of a configuration of an MRAM 600 according to a fifth modification of the first embodiment.

FIG. 8 is a circuit diagram showing an example of a configuration of an MRAM 600 (hereinafter, also simply "memory 600") according to a fifth modification of the first embodiment. The fifth modification differs from the first embodiment in that the memory cell array MCA is that for an MRAM. Other configurations of the fifth modification can be identical to corresponding configurations of the first embodiment. Therefore, the respective configurations of the preamplifier PA, the equalization circuit EQ, the transfer gate circuit TG, and the sense amplifier SA of the fifth modification can be identical to those of the first embodiment.

The memory 600 includes a plurality of memory cells MC within the memory cell array MCA. Each of the memory cells MC serving as a first memory cells includes an MTJ element and a selection transistor ST. The selection transistor ST is inserted/connected between the MTJ element and the first bit line BL and transmits data according to a resistance of the MTJ element to the first bit line BL. The gate of the selection transistor ST is connected to one word line WL.

One reference cell MCref is provided commonly to a plurality of memory cells MC. The reference cell MCref consists of a reference element MTJref and a reference cell transistor STref. The reference cell transistor STref is connected between the reference element MTJref and one reference bit line BLref, and can transmit data (reference data) according to a resistance of the reference element MTJref to the reference bit line BLref. It suffices to set the resistance of the reference element MTJref to substantially an intermediate value between the resistance of the MTJ element storing data "1" and that of the MTJ element storing data "0". With this setting, the data (first logical data) stored in each memory cell MC can be detected by comparing the first logical data with the reference data serving as a second logical data. The gate of the reference cell transistor STref is connected to one reference word line WLref.

The reference cell MCref is connected to the reference bit line BLref. One reference bit line BLref is provided commonly to a plurality of bit lines BL.

The data read operation according to the fifth modification differs from that according to the first embodiment in the operation performed in the memory cell array MCA. However, the respective operations of the preamplifier PA, the equalization circuit EQ, the transfer gate circuit TG, and the sense amplifier SA can be identical to those according to the first embodiment.

In the fifth modification, the data from the bit line BL is compared with the reference data from the reference bit line BLref. Therefore, it may be considered to replace "BL1" and "BL1b" shown in FIG. 3 by "BL" and "BLref". Furthermore, the MRAM is a nondestructive read memory. Therefore, the memory 600 according to the fifth modification does not need to perform the write-back operation in the period from the time t7 to the time t8 shown in the timing chart of FIG. 3. Furthermore, this memory is a memory recognizing between "1" and "0" based on whether the bit line potential is eased by reflecting a direction of spin on a resistance voltage, but not a memory recognizing between "1" and "0" based on quantity of charges released from a bit line through a memory cell as per a DRAM, a molecular memory, FeRAM and the like. The memory 600 according to the fifth modification can achieve effects identical to those of the first embodiment.

Figure 15:
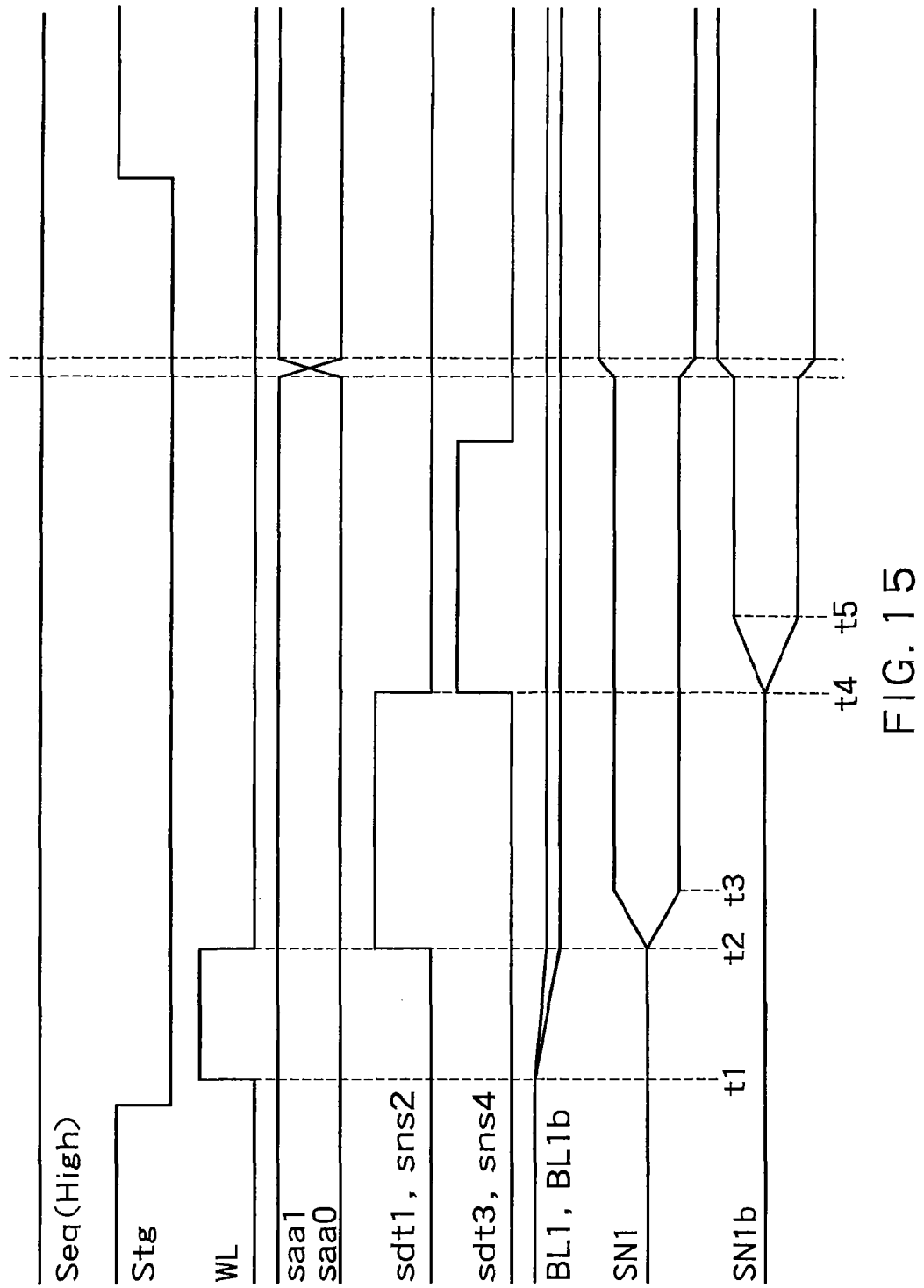
FIG. 15 is a timing chart showing a data read operation performed by the memories shown in FIGS. 4 to 8.

FIG. 15 is a timing chart showing a data read operation performed by the memories shown in FIGS. 4 to 8. The memories shown in FIG. 4 to 8 read data by flowing or discharging current or charges through a memory cell, but not by transmitting a potential of a memory cell to a bit line as per DRAM and the like. Therefore, large amount of charge continuously flows through the memory cell, if flowing period or discharging period is limited.

In the present embodiments, a word line is selected in a predetermined period t1 to t2, and current or charge flows from a bit line through a memory cell in the predetermined period t1 to t2. The potential difference between the bit lines BL1 and BL1b is preamplified in a period t2 to t3 at the sense node SN1 and in a period t4 to t5 at the sense node SN1b.

Sixth Modification of First Embodiment

Figure 13:
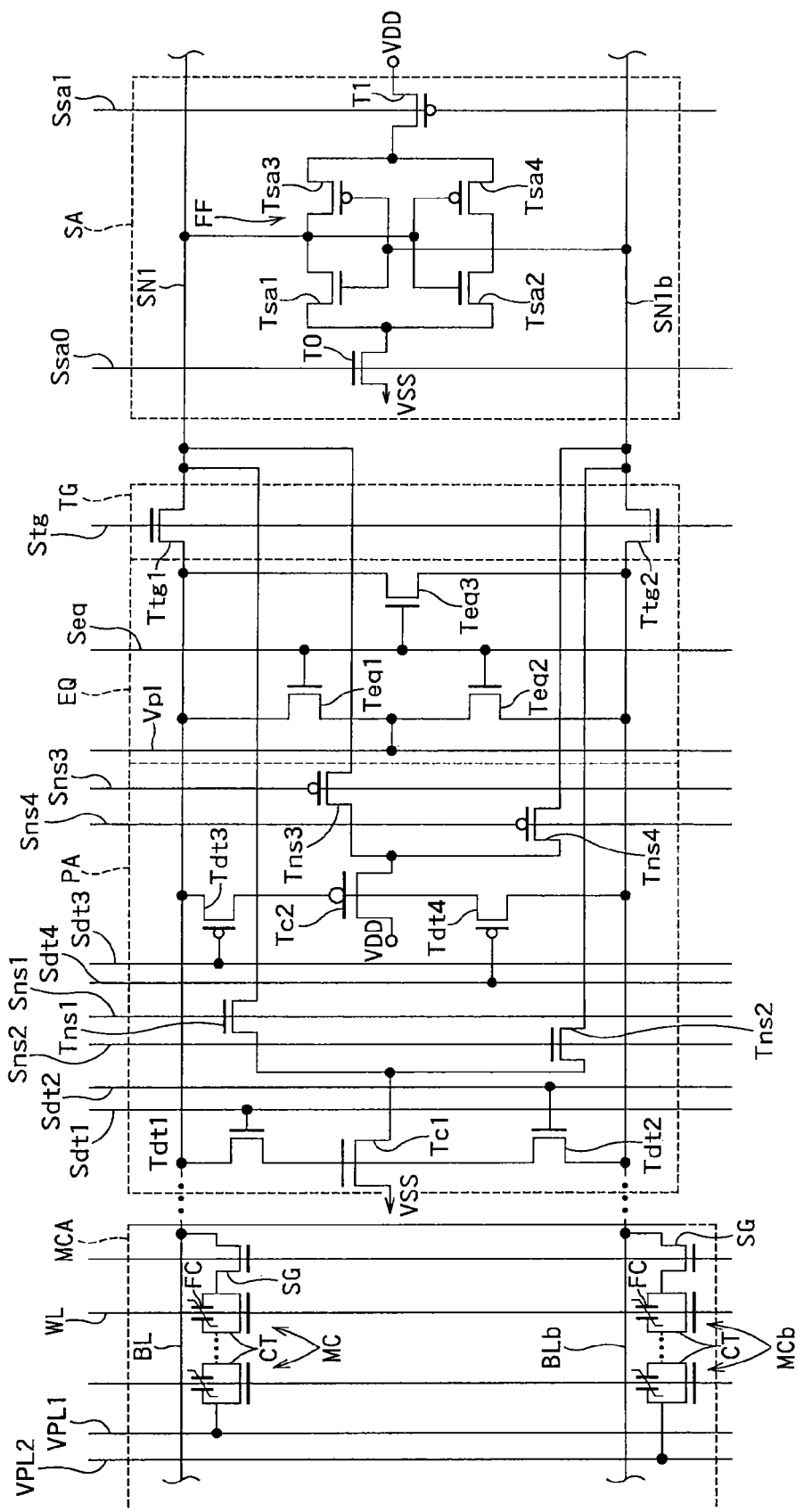
FIG. 13 is a circuit diagram showing an example of a configuration of an FeRAM 900 according to a sixth modification of the first embodiment.

FIG. 13 is a circuit diagram showing an example of a configuration of an FeRAM 900 (hereinafter, also simply "memory 900") according to a sixth modification of the first embodiment. The sixth modification differs from the first embodiment in that the memory cell array MCA is that for an FeRAM. Other configurations of the sixth modification can be identical to corresponding configurations of the first embodiment. Therefore, the respective configurations of the preamplifier PA, the equalization circuit EQ, the transfer gate circuit TG, and the sense amplifier SA of the sixth modification can be identical to those of the first embodiment.

The memory 900 is a series-connected TC unit type ferroelectric RAM. Both ends of a ferroelectric capacitor FC are connected between a source and a drain of a cell transistor CT, respectively, and this structure is defined as a unit cell (the memory cell MC or MCb). The memory 900 is configured so that a plurality of unit cells (the memory cells MC or MCb) are connected in series.

For example, in a case of a 1T-1C FeRAM, it suffices to define that the memory cells MC are the memory cells storing the logical data and that the memory cells MCb are the reference cells storing the reference data. In this case, one memory cell MC stores therein one logical data. In this case, because it suffices to provide one MCb for a plurality of memory cells MC, each memory cell MC stores therein one logical data.

Furthermore, in a case of, for example, a 2T-2C FeRAM, the memory cells MC and MCb store therein the mutually complementary data. In this case, a pair of memory cells MC and MCb stores therein one logical data.

The data read operation according to the sixth modification differs from that according to the first embodiment in the operation performed in the memory cell array MCA. However, the respective operations of the preamplifier PA, the equalization circuit EQ, the transfer gate circuit TG, and the sense amplifier SA can be identical to those according to the first embodiment. Therefore, the memory 900 according to the sixth modification can achieve effects identical to those of the first embodiment.

Second Embodiment

Figure 9:
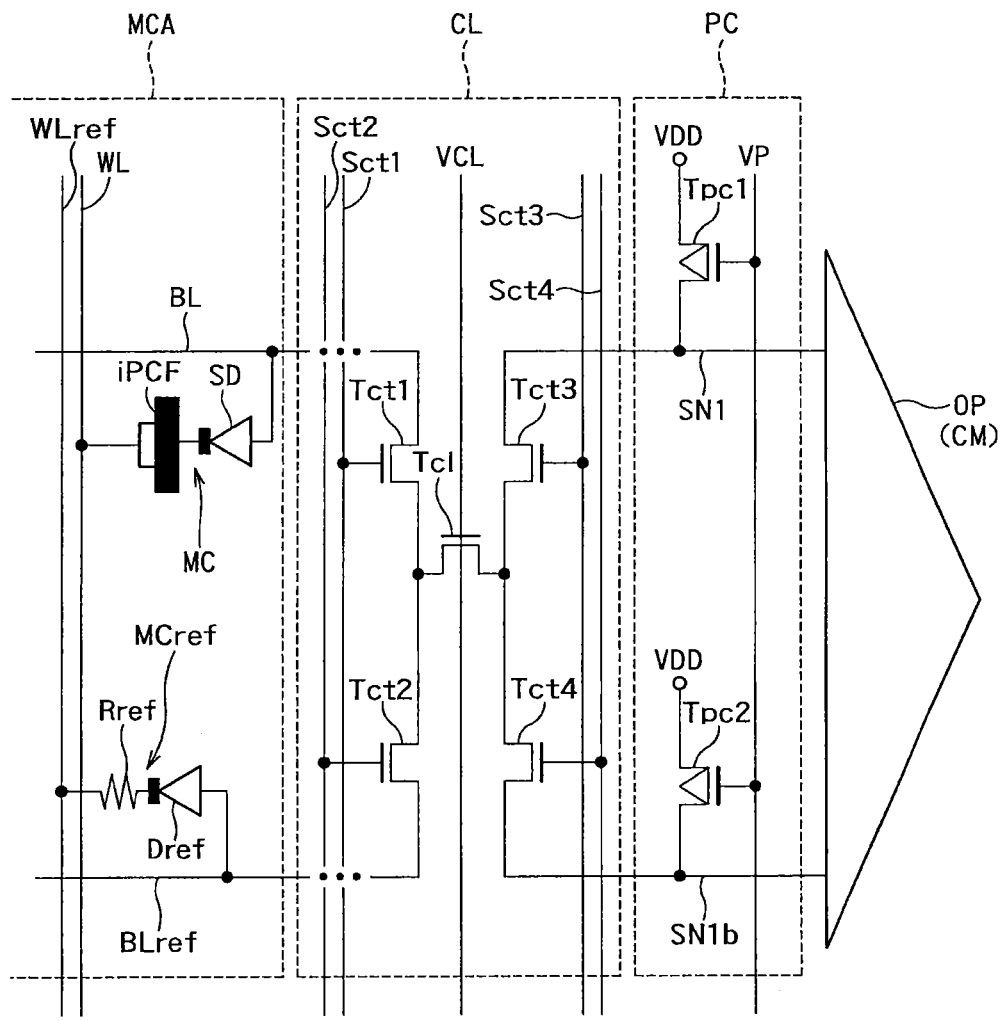
FIG. 9 is a block diagram showing an example of a configuration of a PRAM 700 according to a second embodiment.

FIG. 9 is a block diagram showing an example of a configuration of a PRAM 700 (hereinafter, also "memory 700") according to a second embodiment. The memory 100 according to the first embodiment uses the preamplifier PA at the time of data detection. On the other hand, the second embodiment is different from the first embodiment in that the memory 700 uses a clamp transistor circuit CL at the time of data detection.

The memory 700 includes the memory cell array MCA, the clamp transistor circuit CL, a precharge circuit PC, and an operational amplifier OP.

The memory cell array MCA includes a plurality of PCM memory cells MC. It suffices that the interior of the memory cell array MCA is configured similarly to that of the memory cell array MCA according to the second modification of the first embodiment.

The clamp transistor circuit CL includes a common clamp transistor Tcl and first to fourth current transfer transistors Tct1 to Tct4. The common clamp transistor Tcl is connected to one first bit line (hereinafter, also simply "bit line") BL via the first current transfer transistor Tct1, and connected to one second bit line (hereinafter, also "reference bit line") BLref complementary to the first bit line BL via the second current transfer transistor Tct2. That is, the first current transfer transistor Tct1 is connected between the common clamp transistor Tcl and the bit line BL. The second current transfer transistor Tct2 is connected between the common clamp transistor Tcl and the complementary bit line BLref.

Furthermore, the common clamp transistor Tcl is connected to the sense node SN1 via a third current transfer transistor Tct3, and connected to the sense node SN1$b$ via a fourth current transfer transistor Tct4. That is, the third current transfer transistor Tct3 is inserted/connected between the common clamp transistor Tcl and the sense node SN1. The fourth current transfer transistor Tct4 is inserted/connected between the common clamp transistor Tcl and the sense node SN1$b$.

A gate of the common clamp transistor Tcl is connected to a gate voltage line VCL. Gates of the first to fourth current transfer transistors Tct1 to Tct4 are connected to signal lines Sct1 to Sct4, respectively.

During a data read operation, the common clamp transistor Tcl carries a current to the memory cell MC from the first sense node SN1 via the first bit line BL. At this time, the common clamp transistor Tcl carries a current according to the logic of the data stored in the memory cell MC to the memory cell MC via the first and third current transfer transistors Tct1 and Tct3. Furthermore, during the data read operation, the common clamp transistor Tcl carries a current to the reference cell MCref from the second sense node SN1$b$ via the second bit line BLref. At this time, the common clamp transistor Tcl carries a reference current according to the logic of the reference data stored in the reference cell MCref to the reference cell MCref via the second and fourth current transfer transistors Tct2 and Tct4.

During the data read operation, the common clamp transistor Tcl carries a current according to the resistance value (data logic) of the memory cell MC. Furthermore, the common clamp transistor Tcl carries a reference current according to the resistance (data logic) of the reference cell MCref. The reference cell MCref is set to have a resistance value that is an intermediate value between the resistance value of the memory cell MC storing data "1" and that of the memory cell MC storing data "0". The reference current is designed to be an intermediate current between the current flowing to the memory cell MC storing data "1" and that flowing to the memory cell MC storing data "0".

The precharge circuit PC includes precharge transistors Tpc1 and Tpc2. The precharge transistor Tpc1 is inserted/connected between the power supply voltage VDD and the sense node SN1. The precharge transistor Tpc2 is inserted/connected between the power supply voltage VDD and the sense node SN1$b$. Gates of the precharge transistors Tpc1 and Tpc2 are connected commonly to a gate voltage line VP.

The operational amplifier OP is connected to the sense nodes SN1 and SN1$b$. The operational amplifier OP functions as a sense amplifier that amplifies a current difference or a voltage difference (a signal difference) between the sense nodes SN1 and SN1$b$. The operational amplifier OP includes a current mirror CM serving as a current supply unit. The current mirror CM supplies a current to the memory cell MC or MCref via the sense node SN1 or SN1$b$ and the bit line BL or BLref.

Figure 10:
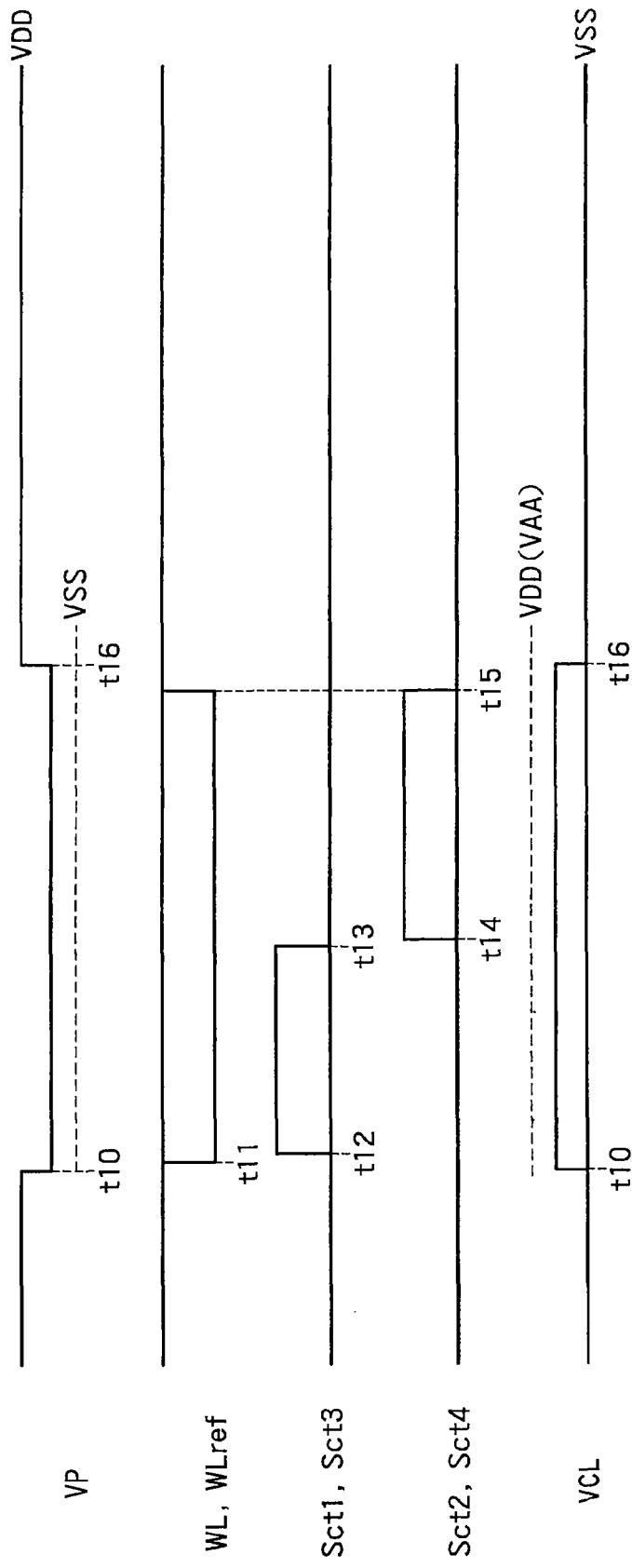
FIG. 10 is a timing chart showing a data read operation performed by the memory 700 according to the second embodiment.

As described later with reference to FIG. 10, the common clamp transistor Tcl is disconnected from the sense node SN1$b$ and the reference bit line BLref when carrying the current to the memory cell MC. Moreover, the common clamp transistor Tcl is disconnected from the sense node SN1 and the bit line BL when carrying the current to the reference cell MCref. Therefore, the common clamp transistor Tcl can individually connect the bit lines BL and BLref to the sense nodes SN1 and SN1$b$ although being shared between the bit lines BL and BLref and between the sense nodes SN1 and SN1$b$.

Figure 16:
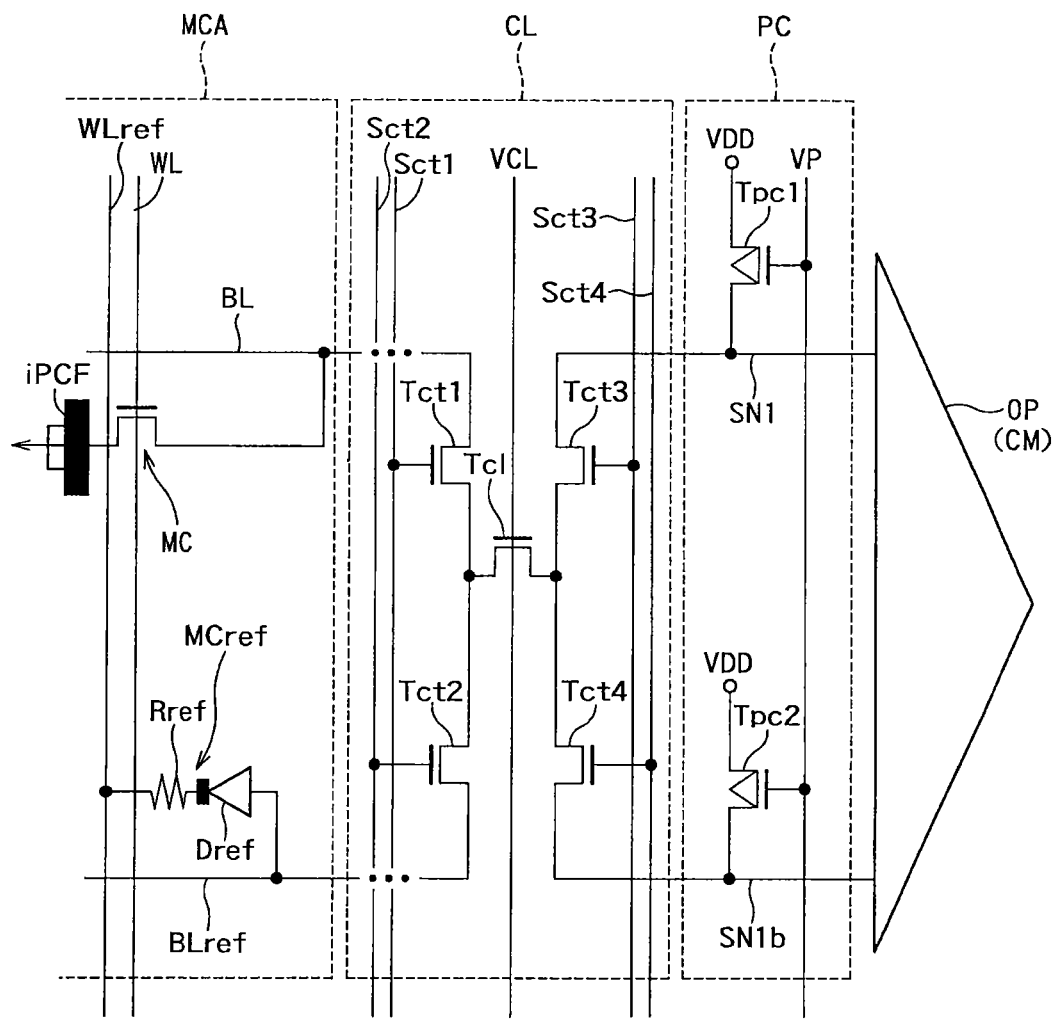
FIG. 16 is a block diagram showing another example of a configuration of a PRAM 1100 according to a second embodiment.

FIG. 16 is a block diagram showing another example of a configuration of a PRAM 1100 (hereinafter, also "memory 1100") according to a second embodiment. The PRAM 1100 includes memory cells each of which has a MOSFET for a select transistor, instead of the select diode SD. The gate of the select transistor is connected to a word line WL. The select transistor is connected between the iPCF and a bit line BL. The select transistor also can select the corresponding memory cell. Therefore, the memory of FIG. 16 can operate likewise the memory of FIG. 9. FIG. 10 is a timing chart showing a data read operation performed by the memory 700 according to the second embodiment. With reference to FIG. 10, the data read operation performed by the memory 700 is explained.

First, prior to the start of the data read operation, the gate voltage VP is in a state of the high level voltage VDD. At this time, the clamp transistor circuit CL and the operational amplifier OP are not operating.

At a time t10, when the data read operation starts, the gate voltage VP is controlled to a low level voltage (a voltage higher than the VSS and lower than the VDD). Furthermore, the gate voltage VCL is controlled so that the bit line is to be a predetermined voltage. The common clamp transistor Tcl is thereby turned on.

At a time t11, the voltage of the selected word line WL and the reference word line WLref are raised to a high level voltage.

Figure 17:
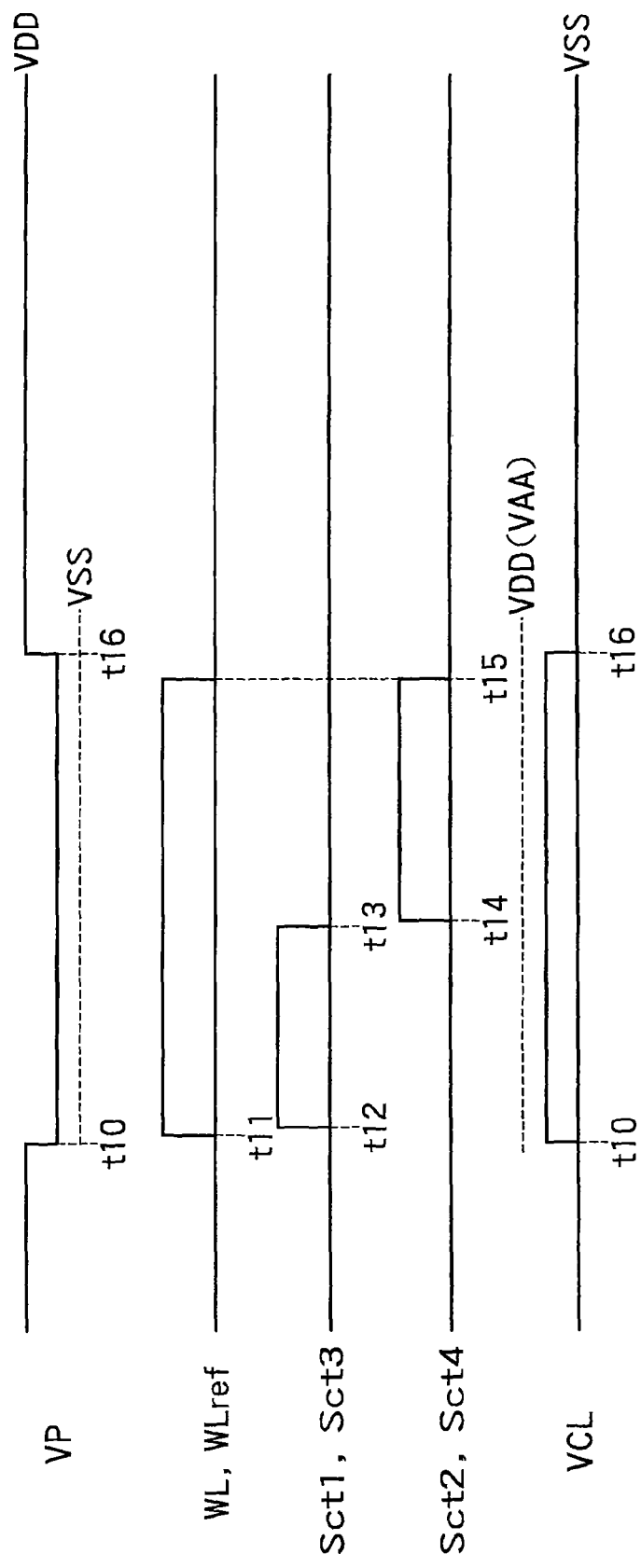
FIG. 17 is a timing chart showing a data read operation performed by the memory 1100 according to the second embodiment.

FIG. 17 is a timing chart showing a data read operation performed by the memory 1100 according to the second embodiment. In the operation, a word line WL rises a logical high, when the word line WL is selected. The other operations of the memory 1100 is similar to those of the memory 700.
(Supply of Current to Memory Cell MC)

At a time t12, the signals Sct1 and Sct3 are raised. The current transfer transistors Tct1 and Tct3 are thereby turned on. Therefore, the sense node SN1 is connected to the bit line BL via the common clamp transistor Tcl and the current transfer transistors Tct1 and Tct3. At this time, because the voltage of the selected word line WL is a low level voltage, the current mirror CM can apply a voltage equal to or higher than the built-in potential Vbi of the selection diode SD to the selection diode SD. The current thereby flows to the memory cell MC via the sense node SN1, the common clamp transistor Tcl, and the bit line BL. At this time, a current according to the resistance of the phase-change film PCF flows to the memory cell MC. The sense node SN1 of the operational amplifier OP can thereby hold a voltage according to the logic of the data stored in the memory cell MC.
(Supply of Current to Reference Cell MCref)

Next, after lowering the signals Sct1 and Sct3 at a time t13, the signals Sct2 and Sct4 are raised at a time t14. The current transfer transistors Tct1 and Tct3 are thereby turned off and the current transfer transistors Tct2 and Tct4 are thereby turned on. Therefore, the sense node SN1 is disconnected from the bit line BL and the sense node SN1$b$ is connected to the reference bit line BLref via the common clamp transistor Tc1 and the current transfer transistors Tct2 and Tct4. At this time, because the voltage of the reference word line WLref is a low level voltage, the current mirror CM can apply the voltage equal to or higher than the built-in potential Vbi of the reference diode Dref to the reference diode Dref. A current thereby flows to the reference cell MCref via the sense node SN1b, the common clamp transistor Tcl, and the reference bit line BLref. At this time, a current according to the resistance of the phase-change film PCF flows to the memory cell MC. The sense node SN1b of the operational amplifier OP can thereby hold a voltage according to the logic of the reference data stored in the reference cell MCref. Meanwhile, the operational amplifier OP compares the voltage of the sense node SN1 according to the data stored in the memory cell MC with the voltage of the sense node SN1 according to the reference data. The operational amplifier OP can thereby detect the logic of the data stored in the memory cell MC.

The clamp transistor circuit CL shifts the timing (the time t12) of transferring the data from the bit line BL to the sense node SN1 from the timing (the time t14) of transferring the reference data from the reference bit line BLref to the sense node SN1b. That is, the clamp transistor circuit CL makes the timing of carrying a cell current according to the logic of the data stored in the memory cell MC to the sense node SN1 different from that of carrying a cell current according to the logic of the reference data stored in the reference cell MCref to the sense node SN1b. The paired sense nodes SN1 and SN1b (or the paired bit lines BL and BLref) can thereby share the single common clamp transistor Tcl.

At a time t15, the word lines WL and WLref are raised and the signals Sct2 and Sct4 are raised. The sense node SN1b is thereby disconnected from the reference bit line BLref.

At a time t16, the gate voltage VP rises. In addition, the gate voltage VCL falls, thereby the data read operation finishes.

According to the second embodiment, the transistor that connects the bit line BL or BLref to the sense node SN1 or SN1b is constituted by the single common clamp transistor Tcl. In other words, the common clamp transistor Tcl carrying the current from the current mirror CM is shared between the paired sense nodes SN1 and SN1b and between the paired bit lines BL and BLref. As a result, even when the signal difference between the data stored in the memory cell MC and the reference data stored in the reference cell MCref becomes further smaller to follow the further downscaling of the memory 700, the operational amplifier OA can accurately detect the data stored in the memory cell MC.

The first embodiment relates to a voltage-preamplifying memory using the preamplifier PA whereas the second embodiment relates to a memory for carrying a current for a certain period using the clamp transistor circuit CL in order to read/write data, and relates to a memory for reading a potential of the drain of the clamp transistor Tcl, which potential is amplified in compare with the bit line potential. The first and second embodiments differ from each other in a data detection method. However, the first and second embodiments are similar in concept as follows. In the first embodiment, the sense transistors (Tc1 and Tc2) for detecting data are provided commonly to the paired bit lines (or the paired sense nodes). In the second embodiment, the clamp transistor Tcl for detecting data is provided commonly to the paired bit lines (or the paired sense nodes).

First Modification of Second Embodiment

Figure 11:
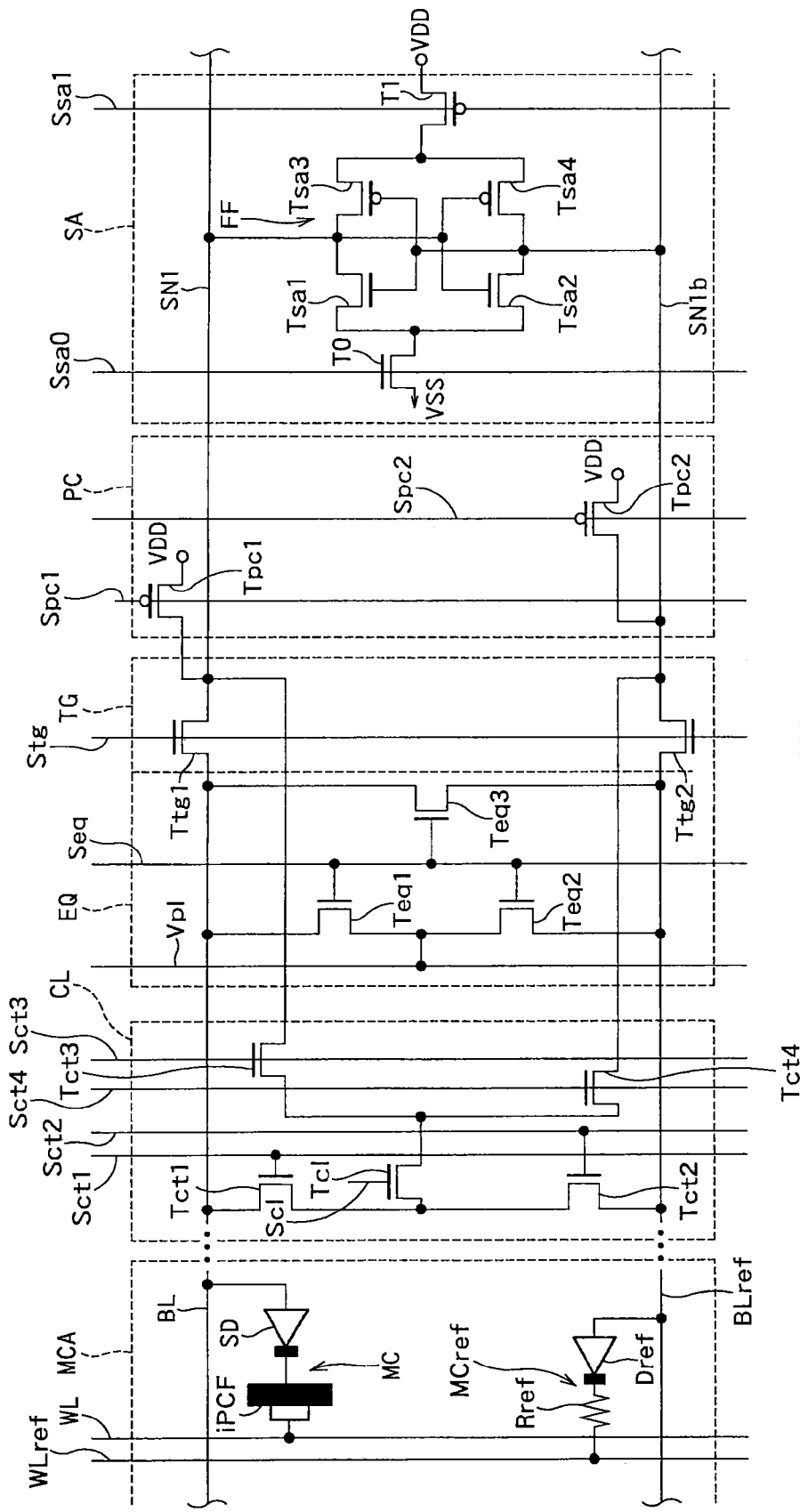
FIG. 11 is a circuit diagram of an example of a configuration of a PRAM 800 according to a first modification of the second embodiment.

FIG. 11 is a circuit diagram of an example of a configuration of a PRAM 800 (hereinafter, also simply "memory 800") according to a first modification of the second embodiment. The first modification is an example of applying the clamp transistor circuit CL to the sense amplifier SA according to the first embodiment. It suffices that the clamp transistor circuit CL is configured similarly to that according to the second embodiment shown in FIG. 9. It suffices that the equalization circuit EQ, the transfer gate circuit TG, and the sense amplifier SA are configured similarly to those according to the first embodiment shown in FIG. 2.

The memory 800 further includes the current supply circuit PC between the sense amplifier SA and the transfer gate circuit TG. The current supply circuit PC includes current supply transistors Tpc1 and Tpc2. The current supply transistors Tpc1 and Tpc2 are formed using, for example, P-transistors, respectively. The current supply transistor Tpc1 is connected between the high level voltage VDD and the sense node SN1. A gate of the current supply transistor Tpc1 is connected to a signal line Spc1. The current supply transistor Tpc2 is connected between the high level voltage VDD and the sense node SN1b. A gate of the current supply transistor Tpc2 is connected to a signal line Spc2. The current supply circuit PC functions to supply an equal current to the paired bit lines BL and BLref or the paired sense nodes SN1 and SN1b.

Figure 12:
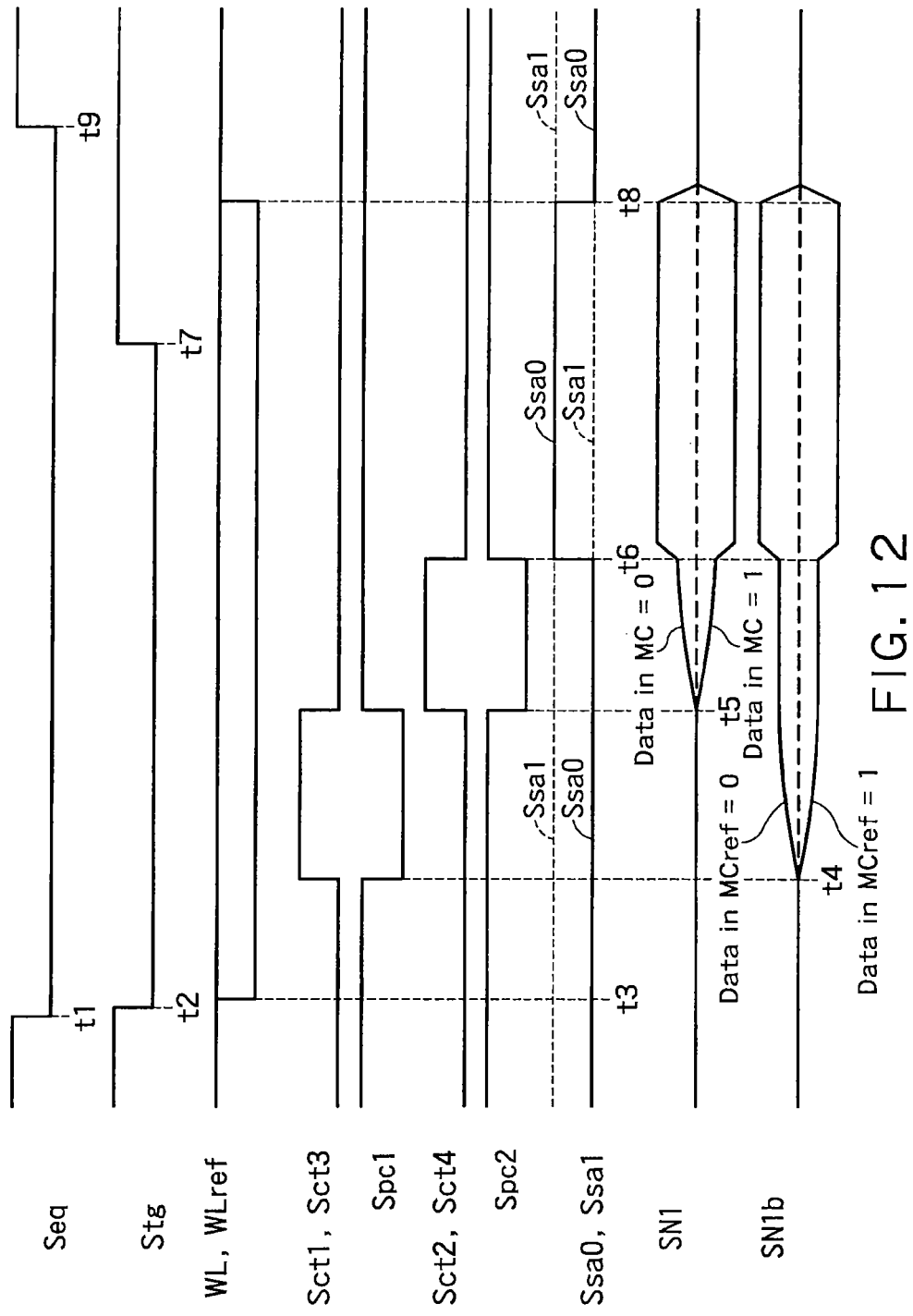
FIG. 12 is a timing chart showing an example of a data read operation performed by the PRAM 800 according to the first modification of the second embodiment.

FIG. 12 is a timing chart showing an example of a data read operation performed by the PRAM 800 according to the first modification of the second embodiment. The data read operation performed by the PRAM 800 is explained while assuming the reference characters of the signal lines such as Seq as those of signals propagated on the respective signal lines Seq and the like.

It suffices that the signals Seq and Stg operate similarly to those shown in FIG. 3, respectively. Furthermore, the word lines WL and WLref operate oppositely to the word lines WL shown in FIG. 3, and the voltages of the selected word line WL and the reference word line WLref are stepped down at the time t3. It suffices that the signals Sct1 and Sct3 and the signals Sct2 and Sct4 operate similarly to the signals Sdt1 and Sns2 and the signals Sdt2 and Sns1 shown in FIG. 3, respectively. It suffices that the signals Ssa0 and Ssa1 operate similarly to the signals Ssa0 and Ssa1 shown in FIG. 3, respectively. Therefore, explanations of the operation performed by the memory 800 from the time t1 to the time t4 are omitted herein.

From the time t4 to the time t5, the signals Sct1 and Sct3 are raised to logical high. The bit line BL is thereby connected to the sense node SN1. At this time, the signal Spc1 is lowered. The current supply transistor Tpc1 thereby connects the power supply voltage VDD to the sense node SN1. The current from the power supply voltage VDD flows to the memory cell MC via the sense node SN1, the common clamp transistor Tcl, and the bit line BL. The current flowing at this time is a cell current according to the logic of the data stored in the memory cell MC (resistance value of the phase-change film PCF). The voltage of the sense node SN1 changes to the voltage according to the logic of the data stored in the memory cell MC based on this cell current.

From the time t4 to the time t6, the signals Sct2 and Sct4 are raised to logical high. The bit line BLref is thereby connected to the sense node SN1b. At this time, the signal Spc2 is lowered. The current supply transistor Tpc2 thereby connects the power supply voltage VDD to the sense node SN1b. The current from the power supply voltage VDD flows to the reference cell MCref via the sense node SN1b, the common clamp transistor Tcl, and the bit line BLref. The current flowing at this time is a cell current according to the logic of the reference data stored in the reference cell MCref (resistance value of the reference resistor Rref). The voltage of the sense node SN1b changes to the voltage according to the logic of the reference data based on this cell current. In FIG. 12, the voltage of the sense node SN1b hardly changes.

At the time t6, the signals Ssa0 and Ssa1 are raised to logical high. The sense amplifier SA thereby operates. At this time, the voltage of the sense node SN1 differs from the voltage of the sense node SN1b (reference data) depending on the logic of the data from the memory cell MC. The sense amplifier SA amplifies a voltage difference (a signal difference) between the sense nodes SN1 and SN1b and latches this signal difference.

Thereafter, it suffices that the operation at and after the time t7 are similar to that at and after the time t7 shown in FIG. 3. Therefore, explanations of the operation performed by the memory 800 at and after the time t7 are omitted herein.

According to the first modification of the second embodiment, similarly to the second embodiment, the transistor that connects the bit line BL or BLref to the sense node SN1 or SN1b is constituted by the single common clamp transistor Tcl. Therefore, the first modification of the second embodiment can also achieve effects identical to those of the second embodiment.

In the second embodiment and the first modification of the second embodiment, the memory cell MC is configured to adopt the selection diode SD and the reference cell MCref is configured to adopt the reference diode Dref. Alternatively, the memory cell MC can be configured to include the selection transistor ST in place of the selection diode SD and the reference cell MCref can be configured to include the reference cell transistor STref in place of the reference diode Dref as shown in FIG. 5.

The second embodiment and the first modification of the second embodiment are examples of the PRAM. However, the second embodiment and the first modification of the second embodiment can be applied to any of the DRAM (see the memory cell array MCA shown in FIG. 2), the NAND flash memory (see the memory cell array MCA shown in FIG. 4), the iPCM (see the memory cell array MCA shown in FIG. 6), the ReRAM (see the memory cell array MCA shown in FIG. 7), the MRAM (see the memory cell array MCA shown in FIG. 8), and the FeRAM.

In the first embodiment, the first to fifth modifications of the first embodiment, and the first modification of the second embodiment, the equalization circuit EQ is provided to correspond to the paired bit lines BL1 and BL1b or BL and BLref. Alternatively, the equalization circuit EQ can be additionally provided to correspond to the paired sense nodes SN1 and SN1b. With this configuration, before and after the data read operation, the equalization circuits EQ can keep not only the voltages of the paired bit lines BL1 and BL1b or BL and BLref but also those of the paired sense nodes SN1 and SN1b substantially equal.

Second Modification of Second Embodiment

Figure 14:
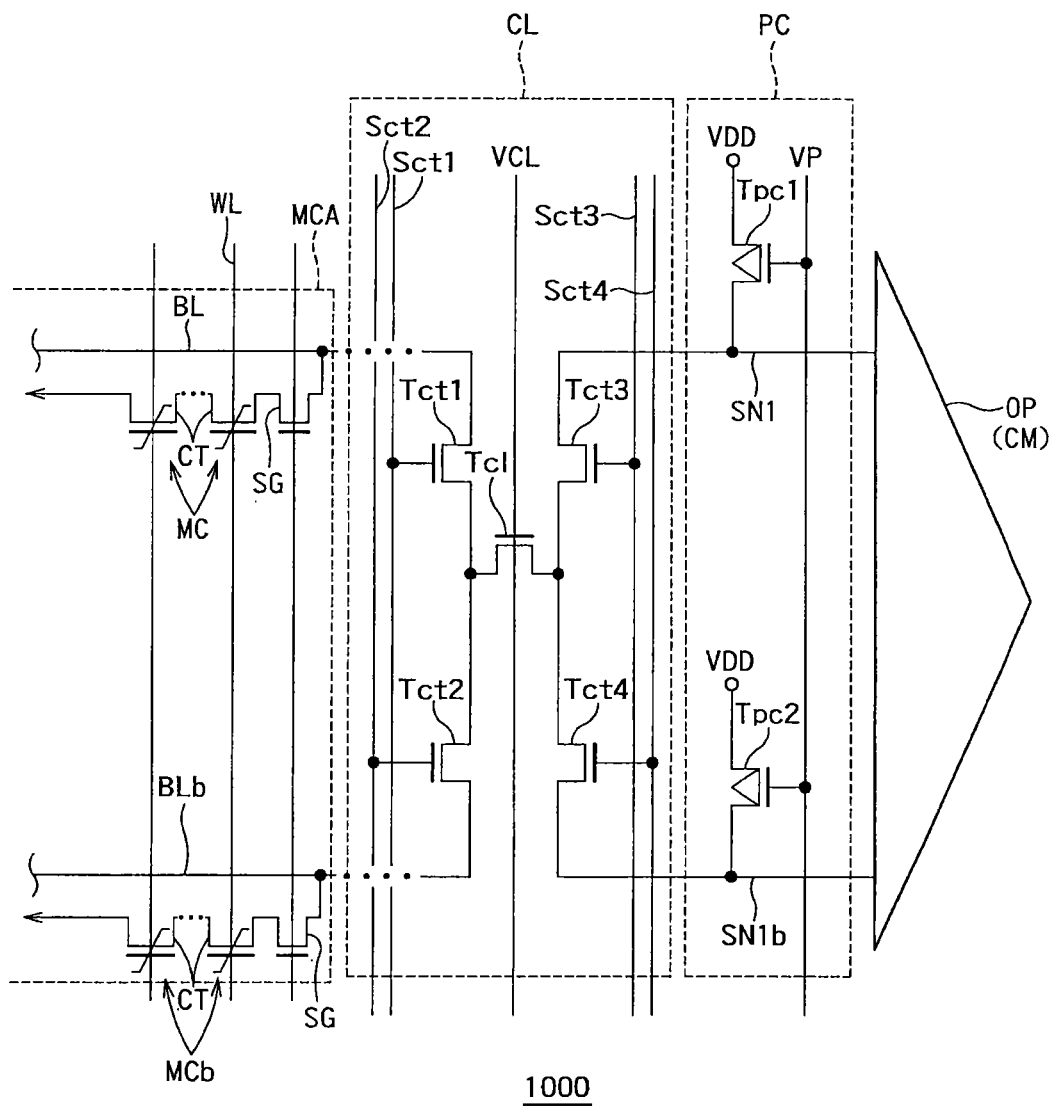
FIG. 14 is a circuit diagram showing an example of a configuration of an FeRAM 1000 according to a second modification of the second embodiment.

FIG. 14 is a circuit diagram showing an example of a configuration of an FeNAND 1000 (hereinafter, also simply "memory 1000") according to a second modification of the second embodiment. The second modification differs from the second embodiment in that the memory cell array MCA is that for an FeNAND in which elements are connected in series. Each element has a ferroelectric film instead of a gate oxide of a MOSFET. It suffices that other constituent elements of the memory 1000 according to the second modification are configured similarly to the corresponding constituent elements of the memory 700 according to the second embodiment. Therefore, it suffices that the clamp transistor circuit CL, the current supply circuit PC, the operational amplifier OP according to the second modification are configured similarly to those according to the second embodiment.

For example, in a case of a 1T-1C FeNAND, it suffices to define that the memory cells MC are the memory cells storing the logical data and that the memory cells MCb are the reference cells storing the reference data. In this case, one memory cell MC stores therein one logical data. In this case, because it suffices to provide one reference cell MCb for a plurality of memory cells MC, each memory cell MC stores therein one logical data.

Meanwhile, for example, in a case of a 2T-2C FeNAND, the memory cells MC and MCb store therein mutually complementary data. In this case, a pair of memory cells MC and MCb stores therein one logical data.

The data read operation according to the second modification differs from that according to the second embodiment in the operation performed in the memory cell array MCA. However, the respective operations of the clamp transistor circuit CL, the current supply circuit PC, and the operational amplifier OP can be identical to those according to the second embodiment. Therefore, the memory 1000 according to the second modification of the second embodiment can achieve effects identical to those of the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a first memory cell storing first logical data;
   a second memory cell storing second logical data or reference data;
   a first bit line connected to the first memory cell;
   a second bit line connected to the second memory cell;
   a first sense node corresponding to the first bit line;
   a second sense node corresponding to the second bit line;
   a first transfer gate inserted or connected between the first bit line and the first sense node;
   a second transfer gate inserted or connected between the second bit line and the second sense node;
   a sense amplifier inserted or connected between the first sense node and the second sense node, the sense amplifier detecting a voltage difference between the first sense node and the second sense node, comparing a voltage of the first sense node with a voltage of the second sense node, or amplifying the voltage difference between the first sense node and the second sense node; and
   a preamplifier comprising a first common transistor which is provided in common to the first and second bit lines and a second common transistor which is provided in common to the first and second bit lines, a gate of the first common transistor being electrically connected to the first or second bit line during a data read operation to apply a first power supply voltage to either the first sense node or the second sense node according to the first logical data and the second logical data or according to the first logical data and the reference data, or a gate of the second common transistor being electrically connected to the first or second bit line during the data read operation to apply a second power supply voltage to the other sense node out of the first sense node and the second sense node according to the first logical data and the second logical data or according to the first logical data and the reference data.

2. The device of claim 1, wherein the preamplifier shifts a timing of applying either the first power supply voltage or the second power supply voltage to the first sense node from a timing of applying the other one of the first power supply voltage and the second power supply voltage to the second sense node.

3. The device of claim 1, wherein
the second common transistor disconnects the second power supply voltage from one of the first sense node or the second sense node when the first common transistor connects the first power supply voltage to the one of the first sense node and the second sense node, and
the first common transistor disconnects the first power supply voltage from the other one of the first sense node and the second sense node when the second common transistor connects the second power supply voltage to the other sense node.

4. The device of claim 2, wherein
the second common transistor disconnects the second power supply voltage from one of the first sense node or the second sense node when the first common transistor connects the first power supply voltage to the one of the first sense node and the second sense node, and
the first common transistor disconnects the first power supply voltage from the other one of the first sense node and the second sense node when the second common transistor connects the second power supply voltage to the other sense node.

5. The device of claim 1, wherein
the preamplifier further comprises:
a first data transfer transistor connected between a gate of the first common transistor and the first bit line;
a second data transfer transistor connected between the gate of the first common transistor and the second bit line;
a first node selection transistor connected between the first common transistor and the first sense node;
a second node selection transistor connected between the first common transistor and the second sense node;
a third data transfer transistor connected between a gate of the second common transistor and the first bit line;
a fourth data transfer transistor connected between the gate of the second common transistor and the second bit line;
a third node selection transistor connected between the second common transistor and the first sense node; and
a fourth node selection transistor connected between the second common transistor and the second sense node.

6. The device of claim 1, wherein
the first logical data and the second logical data are mutually complementary data,
the first common transistor and the second common transistor are an N-transistor and a P-transistor, respectively, and
the first power supply voltage and the second power supply voltage are a low level voltage and a high level voltage, respectively.

7. The device of claim 6, wherein the low level voltage is a ground level, and the high level voltage is an external power supply voltage or an internal power supply voltage supplied to a memory cell array.

8. The device of claim 1, wherein the first memory cell and the second memory cell are any one of a DRAM, a molecular memory, a NAND-type flash memory, a NOR-type flash memory, a BiCS (Bit Cost Scalable Memory), a TCAT, an MRAM, an iPCM, a PRAM, a ReRAM, an FeNAND, a DRAM-type FeRAM, a Chain-type FeRAM, and a Ladder-type FeRAM.

9. A semiconductor storage device comprising:
a first memory cell storing first logical data;
a second memory cell storing second logical data or reference data;
a first bit line connected to the first memory cell;
a second bit line connected to the second memory cell;
a first sense node corresponding to the first bit line;
a second sense node corresponding to the second bit line;
a first transfer gate inserted or connected between the first bit line and the first sense node;
a second transfer gate inserted or connected between the second bit line and the second sense node;
a sense amplifier inserted or connected between the first sense node and the second sense node, the sense amplifier detecting a voltage difference between the first sense node and the second sense node; and
a preamplifier comprising a first common transistor which is provided in common to the first and second bit lines and a second common transistor which is provided in common to the first and second bit lines, a gate of the first common transistor being electrically connected to the first or second bit line during a data read operation in order to apply a first power supply voltage to either the first sense node or the second sense node according to the first logical data and the second logical data or according to the first logical data and the reference data, and a gate of the second common transistor being electrically connected to the first or second bit line during the data read operation in order to apply a second power supply voltage to the other sense node out of the first sense node and the second sense node according to the first logical data and the second logical data or according to the first logical data and the reference data.

10. The device of claim 9, wherein the preamplifier shifts a timing of applying either the first power supply voltage or the second power supply voltage to the first sense node from a timing of applying the other one of the first power supply voltage and the second power supply voltage to the second sense node.

11. The device of claim 9, wherein
the second common transistor disconnects the second power supply voltage from one of the first sense node or the second sense node when the first common transistor connects the first power supply voltage to the one of the first sense node and the second sense node, and
the first common transistor disconnects the first power supply voltage from the other one of the first sense node and the second sense node when the second common transistor connects the second power supply voltage to the other sense node.

12. The device of claim 10, wherein
the second common transistor disconnects the second power supply voltage from one of the first sense node or the second sense node when the first common transistor connects the first power supply voltage to the one of the first sense node and the second sense node, and
the first common transistor disconnects the first power supply voltage from the other one of the first sense node and the second sense node when the second common transistor connects the second power supply voltage to the other sense node.

13. The device of claim 9, wherein
the preamplifier further comprises:
a first data transfer transistor connected between a gate of the first common transistor and the first bit line;
a second data transfer transistor connected between the gate of the first common transistor and the second bit line;
a first node selection transistor connected between the first common transistor and the first sense node;
a second node selection transistor connected between the first common transistor and the second sense node;
a third data transfer transistor connected between a gate of the second common transistor and the first bit line;
a fourth data transfer transistor connected between the gate of the second common transistor and the second bit line;
a third node selection transistor connected between the second common transistor and the first sense node; and
a fourth node selection transistor connected between the second common transistor and the second sense node.

14. The device of claim 9, wherein
the first logical data and the second logical data are mutually complementary data,
the first common transistor and the second common transistor are an N-transistor and a P-transistor, respectively, and
the first power supply voltage and the second power supply voltage are a low level voltage and a high level voltage, respectively.

15. The device of claim 14, wherein the low level voltage is a ground level, and the high level voltage is an external power supply voltage or an internal power supply voltage supplied to a memory cell array.

16. The device of claim 9, wherein the first memory cell and the second memory cell are any one of a DRAM, a molecular memory, a NAND-type flash memory, a NOR-type flash memory, a BiCS (Bit Cost Scalable Memory), a TCAT, an MRAM, an iPCM, a PRAM, a ReRAM, an FeNAND, a DRAM-type FeRAM, a Chain-type FeRAM, and a Ladder-type FeRAM.

* * * * *